(12) United States Patent
Ogawa et al.

(10) Patent No.: US 11,501,821 B2
(45) Date of Patent: Nov. 15, 2022

(54) THREE-DIMENSIONAL MEMORY DEVICE CONTAINING A SHARED WORD LINE DRIVER ACROSS DIFFERENT TIERS AND METHODS FOR MAKING THE SAME

(71) Applicant: SANDISK TECHNOLOGIES LLC, Addison, TX (US)

(72) Inventors: Hiroyuki Ogawa, Nagoya (JP); Ken Oowada, Fujisawa (JP); Mitsuteru Mushiga, Kuwana (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 17/090,080

(22) Filed: Nov. 5, 2020

(65) Prior Publication Data
US 2022/0139441 A1    May 5, 2022

(51) Int. Cl.
| G11C 16/06 | (2006.01) |
| --- | --- |
| G11C 11/408 | (2006.01) |
| G11C 5/06 | (2006.01) |
| G11C 5/02 | (2006.01) |
| G11C 11/4094 | (2006.01) |

(52) U.S. Cl.
CPC .......... *G11C 11/4085* (2013.01); *G11C 5/025* (2013.01); *G11C 5/06* (2013.01); *G11C 11/4094* (2013.01)

(58) Field of Classification Search
CPC ... G11C 11/4085; G11C 115/025; G11C 5/06; G11C 11/4094
USPC .................................................... 365/185.23
See application file for complete search history.

(56) References Cited

U.S. PATENT DOCUMENTS

| 10,283,493 B1 | 5/2019 | Nishida |
| --- | --- | --- |
| 10,665,581 B1 | 5/2020 | Zhou et al. |

(Continued)

FOREIGN PATENT DOCUMENTS

| WO | WO 2017-213720 A1 | 12/2017 |
| --- | --- | --- |
| WO | WO 2020-056664 A1 | 3/2020 |

(Continued)

OTHER PUBLICATIONS

Endoh, T. et al., "Novel Ultra High Density Memory with a Stacked-Surrounding Gate Transistor (S-SGT) Structured Cell," IEDM Proc., (2001), 33-36.

(Continued)

*Primary Examiner* — Huan Hoang
(74) *Attorney, Agent, or Firm* — The Marbury Law Group PLLC

(57) ABSTRACT

A semiconductor structure includes a peripheral circuit, a first three-dimensional memory array overlying the peripheral circuit and including a first alternating stack of first insulating layers and first electrically conductive layers containing first word lines and first select lines, and first memory stack structures vertically extending through the first alternating stack, and a second three-dimensional memory array overlying the first three-dimensional memory array and including a second alternating stack of second insulating layers and second electrically conductive layers containing second word lines and second select lines, and second memory stack structures vertically extending through the second alternating stack. The peripheral circuit includes a first word line driver circuit having first word line driver output nodes electrically connected to at least some of the first word lines and at least some of the second word lines, and each first word line is electrically connected to a respective second word line.

2 Claims, 34 Drawing Sheets

(56) References Cited

U.S. PATENT DOCUMENTS

| | | |
|---|---|---|
| 10,811,058 B2 | 10/2020 | Zhang et al. |
| 2019/0067314 A1 | 2/2019 | Lu et al. |
| 2019/0221557 A1 | 7/2019 | Kim et al. |
| 2020/0279861 A1* | 9/2020 | Uryu .................. H01L 25/0657 |
| 2021/0233900 A1 | 7/2021 | Kim et al. |
| 2021/0327482 A1* | 10/2021 | Tang .................. H01L 27/2454 |
| 2021/0391351 A1 | 12/2021 | Takimoto et al. |

FOREIGN PATENT DOCUMENTS

| | | |
|---|---|---|
| WO | WO 2020-124878 A1 | 6/2020 |
| WO | WO 2020/149943 A1 | 7/2020 |
| WO | WO 2020/163003 A1 | 8/2020 |

OTHER PUBLICATIONS

U.S. Appl. No. 16/936,047, filed Jul. 22, 2020, SanDisk Technologies LLC.
U.S. Appl. No. 16/249,423, filed Jan. 16, 2019, SanDisk Technologies LLC.
U.S. Appl. No. 16/737,088, filed Jan. 8, 2020, SanDisk Technologies LLC.
U.S. Appl. No. 17/090,045, filed Nov. 5, 2020, SanDisk Technologies LLC.
USPTO Office Communication, Notice of Allowance and Fee(s) Due for U.S. Appl. No. 17/090,045, dated Dec. 29, 2021, 14 pages.
Notification of Transmittal of the International Search Report and the Written Opinion of the International Searching Authority for International Patent Application No. PCT/US2021/036631, dated Oct. 20, 2021, 10 pages.

* cited by examiner

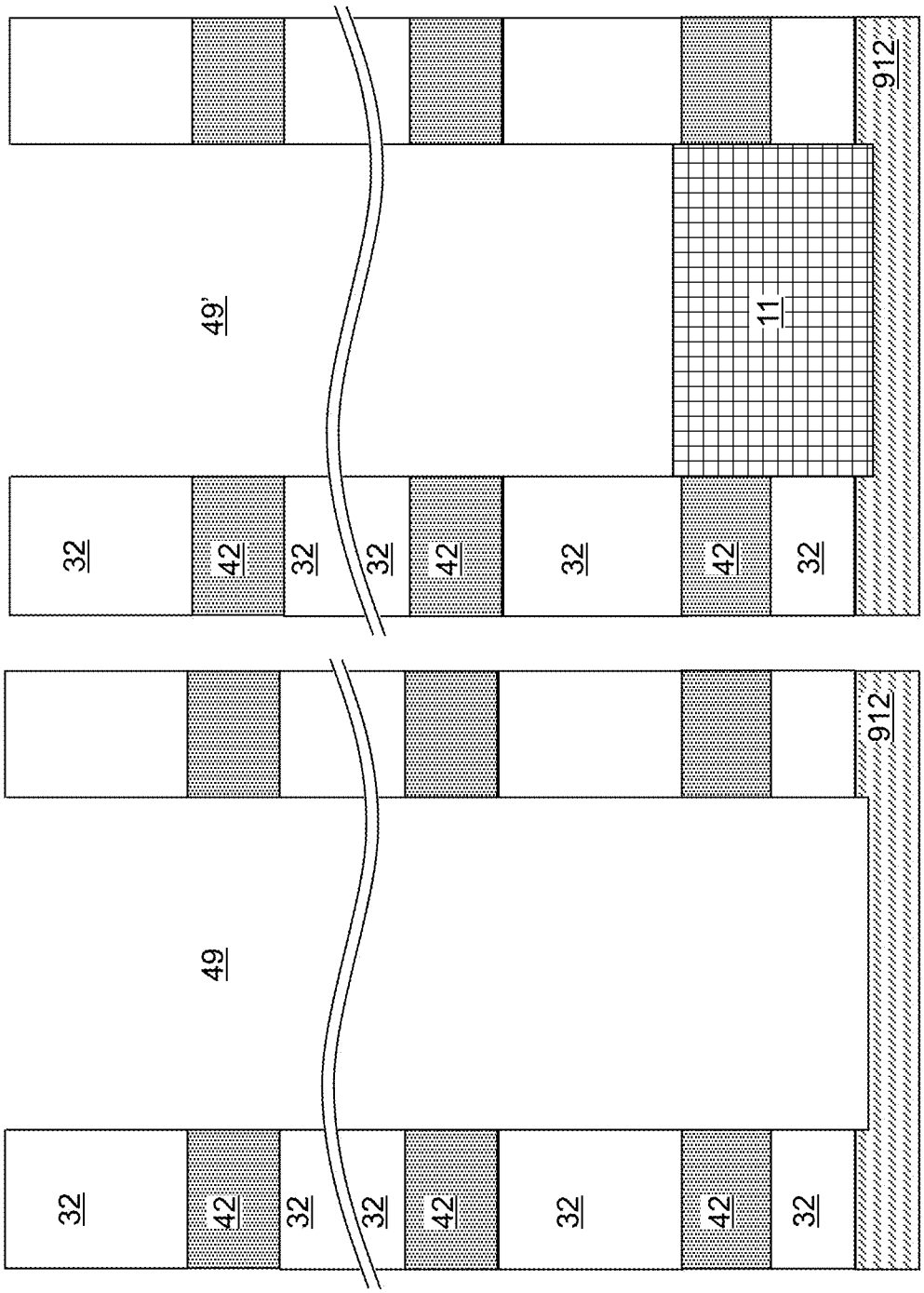

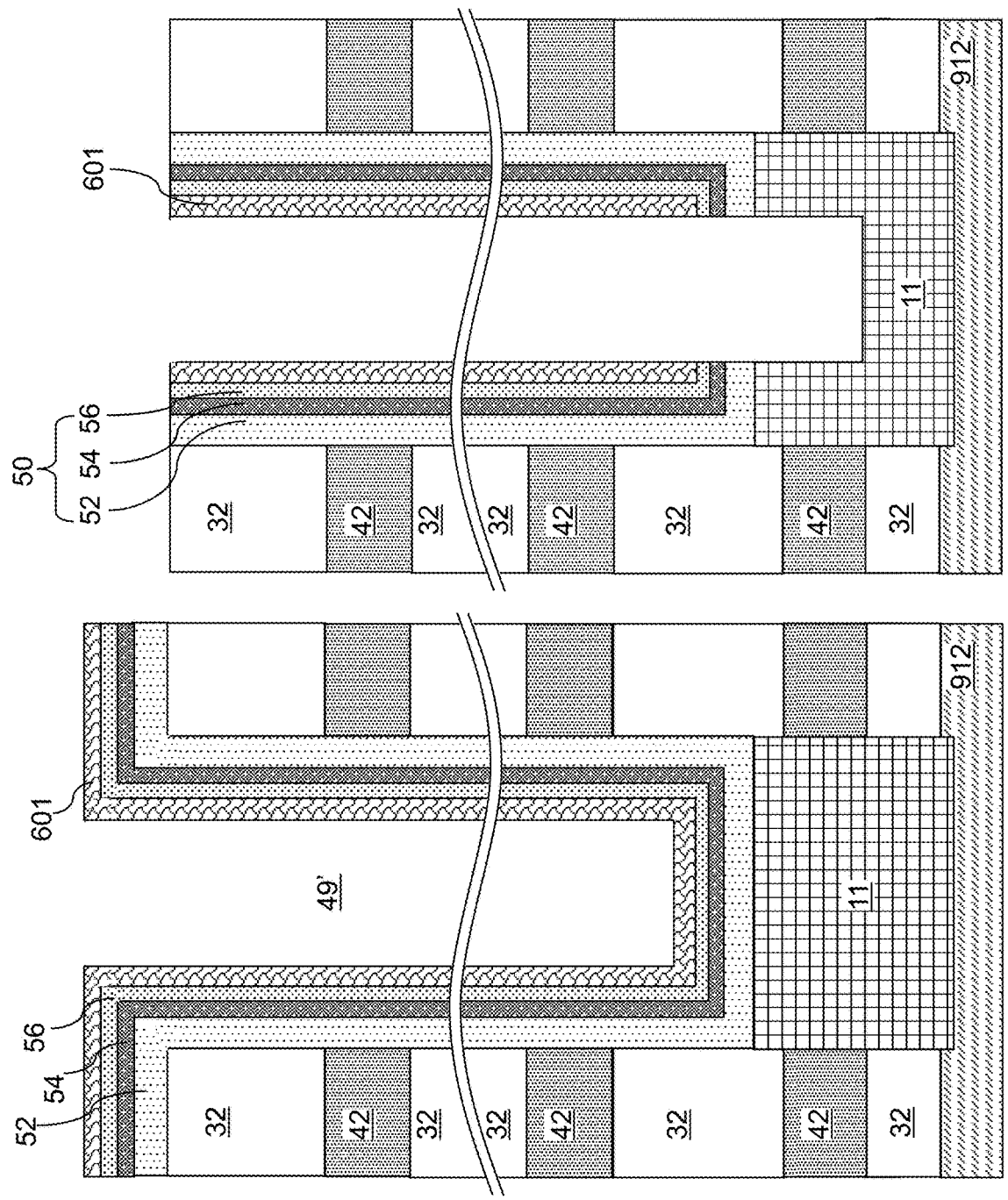

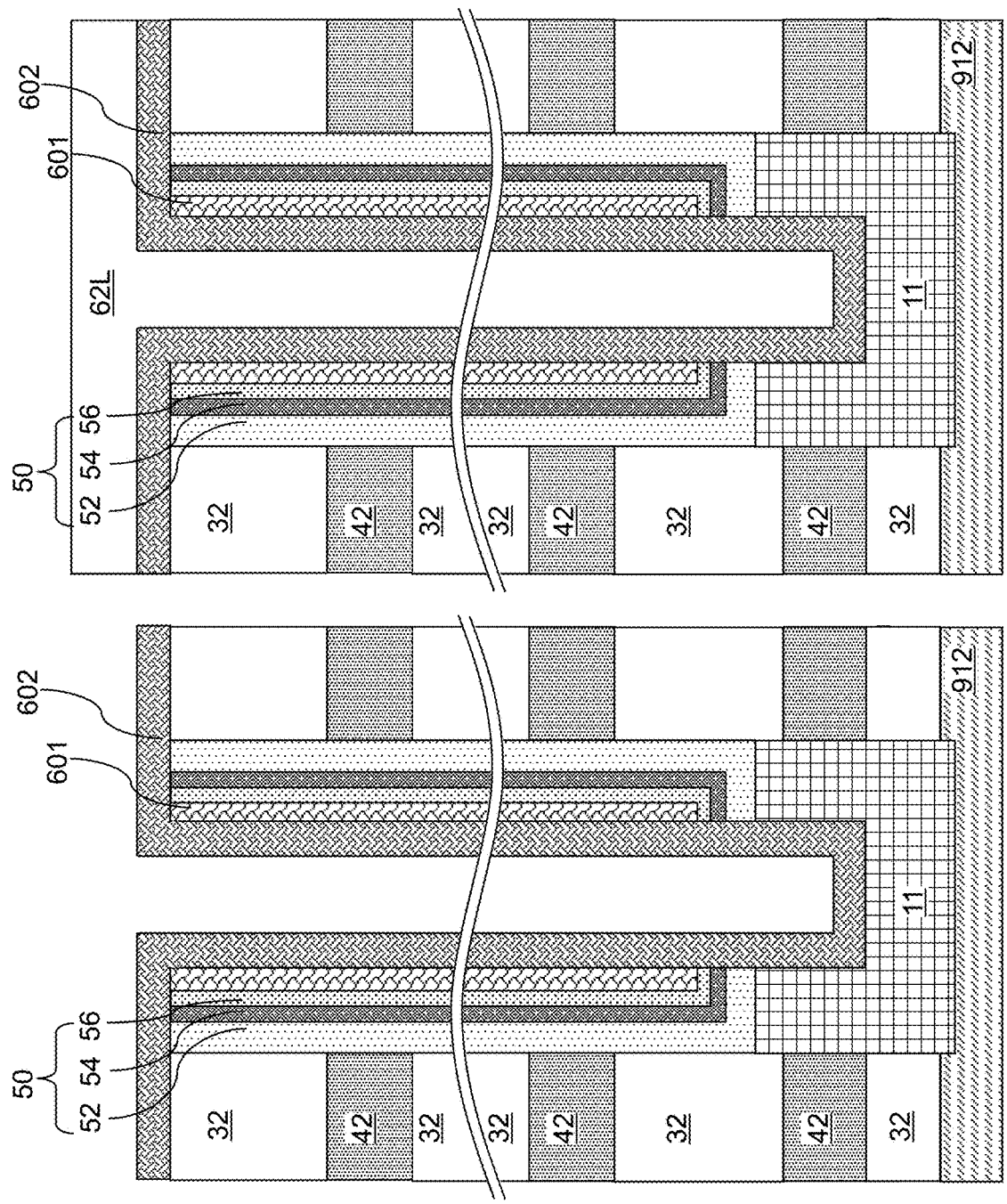

THREE-DIMENSIONAL MEMORY DEVICE CONTAINING A SHARED WORD LINE DRIVER ACROSS DIFFERENT TIERS AND METHODS FOR MAKING THE SAME

FIELD

The present disclosure relates generally to the field of semiconductor devices, and particular to multi-tier three-dimensional memory arrays sharing a word line driver across different tiers, and methods for making the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to one embodiment, a semiconductor structure comprises a first peripheral circuit comprising field effect transistors and dielectric material layers embedding metal interconnect structures, a first three-dimensional memory array overlying the first peripheral circuit and including a first alternating stack of first insulating layers and first electrically conductive layers comprising first word lines and first select lines, and first memory stack structures vertically extending through the first alternating stack, and a second three-dimensional memory array overlying the first three-dimensional memory array and including a second alternating stack of second insulating layers and second electrically conductive layers comprising second word lines and second select lines, and second memory stack structures vertically extending through the second alternating stack. The first peripheral circuit comprises a first word line driver circuit having first word line driver output nodes electrically connected to at least some of the first word lines and at least some of the second word lines, and each first word line is electrically connected to a respective second word line.

According to another embodiment, a method of forming a bonded assembly comprises providing a first semiconductor die comprising a first peripheral circuit comprising field effect transistors and dielectric material layers embedding metal interconnect structures, a first three-dimensional memory array overlying the first peripheral circuit and including a first alternating stack of first insulating layers and first electrically conductive layers comprising first word lines and first select lines, and first memory stack structures vertically extending through the first alternating stack, providing a second semiconductor die comprising a second three-dimensional memory array overlying the first three-dimensional memory array and including a second alternating stack of second insulating layers and second electrically conductive layers comprising second word lines and second select lines, and second memory stack structures vertically extending through the second alternating stack, and bonding the first semiconductor die to the second semiconductor die to form the bonded assembly. The first peripheral circuit comprises a first word line driver circuit having first word line driver output nodes electrically connected to at least some of the first word lines and at least some of the second word lines, and each first word line is electrically connected to a respective second word line.

According to another embodiment, a bonded assembly comprises a first semiconductor die comprising a first three-dimensional memory array including a first alternating stack of first insulating layers and first electrically conductive layers comprising first word lines and first select lines, and first memory stack structures vertically extending through the first alternating stack, a second semiconductor die comprising a second three-dimensional memory array including a second alternating stack of second insulating layers and second electrically conductive layers comprising second word lines and second select lines, and second memory stack structures vertically extending through the second alternating stack, and a third semiconductor die comprising a peripheral circuit containing a word line driver circuit comprising word line driver output nodes electrically connected to the first word lines and electrically connected to the second word lines. Each of the first word lines is electrically connected to a respective one of the second word lines.

According to another embodiment, a method of making bonded assembly comprises providing a first semiconductor die comprising a first three-dimensional memory array including a first alternating stack of first insulating layers and first electrically conductive layers comprising first word lines and first select lines, and first memory stack structures vertically extending through the first alternating stack, providing a second semiconductor die comprising a second three-dimensional memory array including a second alternating stack of second insulating layers and second electrically conductive layers comprising second word lines and second select lines, and second memory stack structures vertically extending through the second alternating stack, providing a third semiconductor die comprising a peripheral circuit containing a word line driver circuit comprising word line driver output nodes, and bonding the first, the second and the third semiconductor dies such that the word line driver output nodes are electrically connected to the first word lines and electrically connected to the second word lines, and each of the first word lines is electrically connected to a respective one of the second word lines.

BRIEF DESCRIPTION OF THE DRAWINGS

FIGS. 4A-4H illustrate sequential vertical cross-sectional views of a memory opening during formation of a memory opening fill structure according to the first embodiment of the present disclosure.

DETAILED DESCRIPTION

Figure 1:
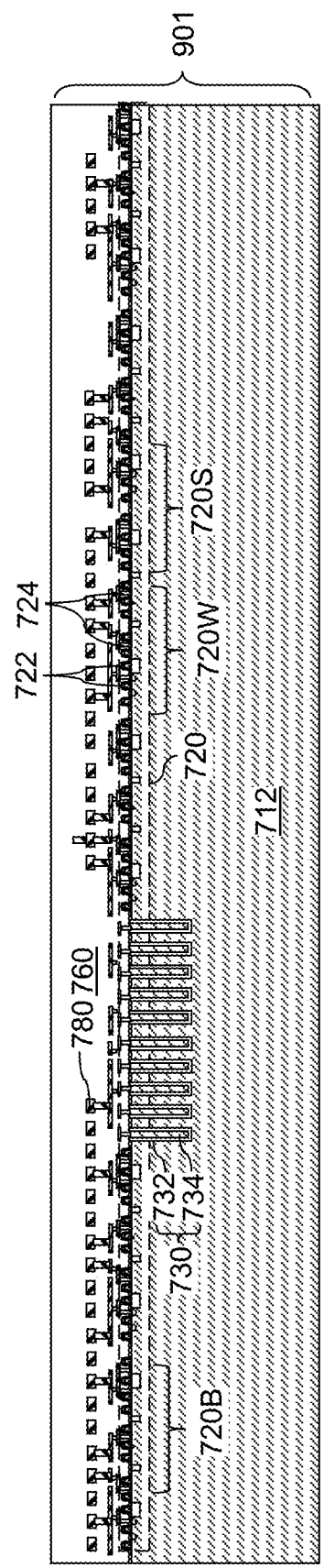
FIG. 1 is a vertical cross-sectional view of a first exemplary structure after formation of a peripheral circuit over a semiconductor substrate according to a first embodiment of the present disclosure.

As discussed above, the embodiments of the present disclosure are directed to multi-tier three-dimensional memory devices sharing one or more word line drivers between different tiers and methods for making the same, the various aspects of which are described herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a three-dimensional NAND string memory device, and may be fabricated using the various embodiments described herein. The three-dimensional NAND string is located in A three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a first exemplary structure according to a first embodiment of the present disclosure is illustrated, which can be employed, for example, to fabricate a three-dimensional memory die including a three-dimensional array of memory elements such as a three-dimensional array of NAND memory elements or a three-dimensional array of NOR memory elements. While the present disclosure is described employing a three-dimensional array of NAND memory elements, embodiments of the present disclosure can be employed to form a three-dimensional array of NOR memory elements, or other types of three-dimensional memory elements.

The first exemplary structure includes a first semiconductor die 901. The first semiconductor die 901 includes a first substrate, which includes a substrate semiconductor layer 712. In one embodiment, the first substrate may be a bulk semiconductor substrate such as a commercially available silicon wafer having a diameter in a range from 150 mm to 450 mm and a thickness in a range from 600 microns to 1 mm, or may be a semiconductor-on-insulator (e.g., silicon on insulator, SOI) substrate that includes the semiconductor material layer as a top semiconductor layer overlying a buried oxide layer. The substrate semiconductor layer 712 may comprise a doped well in an upper part of the silicon wafer, an epitaxial silicon layer formed on a silicon wafer or a silicon layer of the SOI substrate, for example. Optionally, deep trenches can be formed through an upper portion of the first substrate, and a combination of a substrate insulating spacer 732 and an laterally-isolated through-substrate via structure 734 can be formed within each deep trench. The depth of each deep trench may be in a range from 1 micron to 20 microns, such as from 2 microns to 10 microns, and the maximum lateral dimension of each deep trench may be in a range from 1 micron to 20 microns, such as from 2 microns to 10 microns, although lesser and greater depths and maximum lateral dimensions can be employed for the deep trenches. Each deep trench may have a horizontal cross-sectional shape of a circle, an ellipse, a rectangle, a rounded rectangle, or a generally curvilinear two-dimensional closed shape. A conformal insulating material layer including an insulating material such as silicon oxide, silicon nitride, silicon oxynitride, and/or a dielectric metal oxide can be deposited in the deep trenches by a conformal deposition process. At least one conductive fill material such as at least one metallic material and/or a heavily doped semiconductor material can be deposited in remaining volumes of the deep trenches after formation of the conformal insulating material layer. Excess portions of the conformal insulating material layer and the at least one metallic material can be removed from above the horizontal plane including the top surface of the first substrate by a planarization process such as a chemical mechanical planarization process. Each remaining portion of the conformal insulating material layer constitutes a substrate insulating spacer 732, and each remaining portion of the at least one conductive material constitutes a laterally-isolated through-substrate via structure 734. Each contiguous combination of a substrate insulating spacer 732 and a laterally-isolated through-substrate via structure 734 constitutes a through-substrate connection structure 730.

A semiconductor circuit configured to control operation of multiple three-dimensional memory arrays can be formed on a top surface of the substrate semiconductor layer 712. The semiconductor circuit comprises a first peripheral circuit 720 configured to control operation of the multiple three-dimensional memory arrays. The first peripheral circuit 720 can comprise complementary metal oxide semiconductor (CMOS) transistors. The first peripheral circuit 720 can comprise first proximal metal interconnect structures 780 embedded within first proximal dielectric material layers 760.

According to an aspect of the present disclosure, the first peripheral circuit 720 comprises first word line driver circuit 720W, a first select line driver circuit 720S, and a first bit line driver circuit 720B. The first word line driver circuit 720W includes word line switching transistors 722 and output nodes 724. The output nodes 724 may comprise source and/or drain electrodes which are electrically connected to the respective source and/or drain regions of the word line switching transistors 722. The output nodes are configured to be subsequently electrically connected to a first subset of the first electrically conductive layers (e.g., first word lines which function as first control gate electrodes) in a first three-dimensional memory array and to be subsequently electrically connected to a first subset of the second electrically conductive layers (e.g., second word lines which function as second control gate electrodes) in a second three-dimensional memory array which is bonded to the first three-dimensional memory array. As used herein, a word line refers to an electrically conductive line that can activate or deactivate access to a selected memory cell. A word line driver refers to a driver configured to drive a word line. A word line driver output node refers to an output node of a word line driver.

In one embodiment, the first select line driver circuit 720S can comprise first select line driver output nodes (e.g., source and/or drain electrodes of driver circuit transistors) that are configured to be electrically connected to a second subset of the first electrically conductive layers (e.g., source side and/or drain side select gate electrodes) of the first three-dimensional memory array and to be electrically isolated from each of the second electrically conductive layers of the second three-dimensional memory array. As used herein, a select line refers to an electrically conductive line that can activate or deactivate access to a block of memory cells. A select line driver refers to a driver configured to drive a select line. A select line driver output node refers to an output node of a select line driver.

In one embodiment, the first select line driver output nodes may include first source-side select line driver output nodes that are configured to be electrically connected to source-side select lines (i.e., source-side select gate electrodes) of the first electrically conductive layers of the first three-dimensional memory array to be subsequently formed. As used herein, a source-side select line refers to an electrically conductive line that can activate or deactivate access to a block of memory cells from a source side. A source-side select line driver refers to a driver configured to drive a source-side select line. A source-side select line driver output node refers to an output node of a source-side select line driver.

In one embodiment, the first select line driver output nodes may also include first drain-side select line driver output nodes that are configured to be electrically connected to drain-side select lines of the first electrically conductive layers of the first three-dimensional memory array to be subsequently formed. As used herein, a drain-side select line refers to an electrically conductive line that can activate or deactivate access to a block of memory cells from a drain-side. A drain-side select line driver refers to a driver configured to drive a drain-side select line. A drain-side select line driver output node refers to an output node of a drain-side select line driver.

In one embodiment, the first bit line driver circuit 720B includes sense amplifiers and other peripheral circuit components. In one embodiment, the first bit line driver circuit 720B has first bit line driver output nodes (e.g., source and/or drain electrodes of sense amplifier transistors) configured to be electrically connected to, and to drive, first bit lines in the first three-dimensional memory array to be subsequently formed. In another embodiment, the first bit line driver circuit 720B has first bit line driver output nodes configured to be electrically connected to, and to drive, a first subset of the first bit lines in the first three-dimensional memory array to be subsequently formed, and a first subset of the second bit lines in a second three-dimensional memory array to be subsequently provided. As used herein, a bit line refers to an electrically conductive line that is electrically connected to a drain and can activate or deactivate a channel of a vertical NAND string. A bit line driver refers to a driver configured to drive a bit line. A bit line driver output node refers to an output node of a bit line driver.

Figure 2:
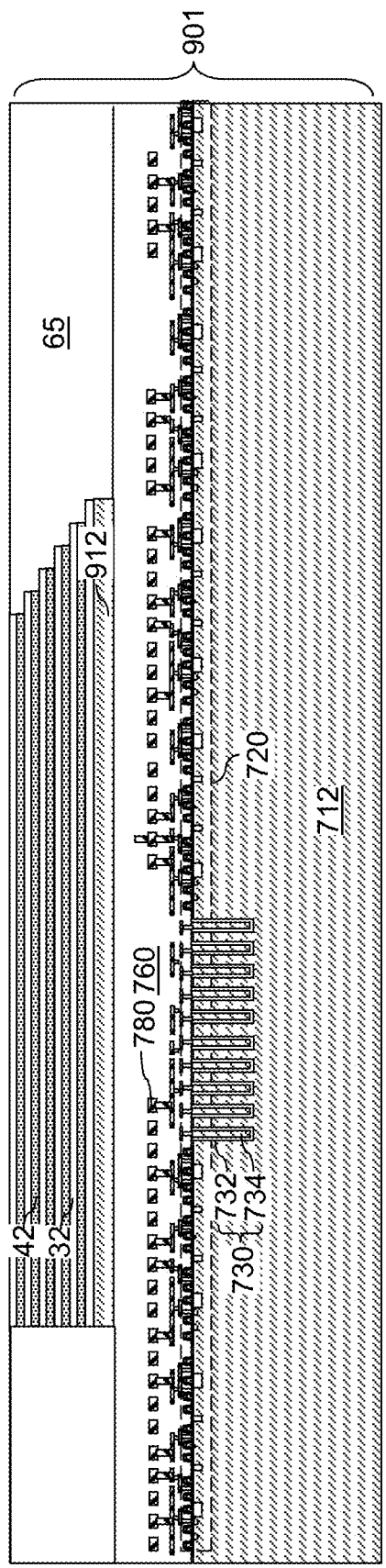
FIG. 2 is a vertical cross-sectional view of the first exemplary structure after formation of a first alternating stack of first insulating layers and first sacrificial material layers according to the first embodiment of the present disclosure.

Referring to FIG. 2, a semiconductor material layer 912 can be formed over the first proximal dielectric material layers 760. In one embodiment, the semiconductor material layer 912 can be formed by depositing a semiconductor material such as silicon, a silicon-germanium alloy, or a compound semiconductor material. For example, the semiconductor material layer 912 can include a polysilicon layer. An alternating stack of insulating layers 32 and sacrificial material layers 42 is formed over the top surface of the semiconductor material layer 912. In one embodiment, the alternating stack (32, 42) can include insulating layers 32 composed of a first material, and sacrificial material layers 42 composed of a second material that is different from the first material and can be subsequently removed selective to the first material. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers 42 can include silicon nitride. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD). The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed.

While the present disclosure is described employing an embodiment in which the spacer material layers are sacrificial material layers 42 that are subsequently replaced with electrically conductive layers, embodiments are expressly contemplated herein in which electrically conductive layers are formed in lieu of the sacrificial material layers 42. In this case, subsequently processing steps for replacing the sacrificial material layers 42 with electrically conductive layers can be omitted.

The alternating stack (32, 42) can be patterned to form stepped surfaces at least one side. As used herein, "stepped surfaces" refer to a set of surfaces that include at least two horizontal surfaces and at least two vertical surfaces such that each horizontal surface is adjoined to a bottom edge of a respective vertical surface, and a top edge of each vertical surface is adjoined to an edge of a respective horizontal surface. A stepped cavity is formed within the volume from which portions of the alternating stack (32, 42) are removed through formation of the stepped surfaces. A "stepped cavity" refers to a cavity having stepped surfaces. Optionally, a non-stepped cavity may be formed on an opposite side of the stepped cavity. As used herein, a non-stepped cavity refers to a cavity without stepped surfaces. Thus, a non-stepped cavity can include straight sidewalls that vertically extend from a bottommost surface of the alternating stack (32, 42) to a topmost surface of the alternating stack (32, 42).

The stepped cavity can have various stepped surfaces such that the horizontal cross-sectional shape of the stepped cavity changes in steps as a function of the vertical distance from the top surface of the semiconductor material layer 912. In one embodiment, the stepped cavity can be formed by repetitively performing a set of processing steps. The set of processing steps can include, for example, an etch process of a type that vertically increases the depth of a cavity by one or more levels, and an etch process of a second type that laterally expands the area to be vertically etched in a subsequent etch process of the type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in a connection (i.e., staircase or terrace) region 200. The connection region 200 includes stepped surfaces of the alternating stack (32, 42) that continuously extend from a bottommost layer within the alternating stack (32, 42) to a topmost layer within the alternating stack (32, 42). Each of the sacrificial material layers 42 has a respective lateral extent. The sacrificial material layers 42 can have different lateral extents along a horizontal direction. In one embodiment, the lateral extents of the sacrificial material layers 42 can increase with a respective vertical distance from the top surface of the semiconductor material layer 912. Each of the insulating layers 32 has a respective lateral extent. The insulating layers 32 can have different lateral extents along the horizontal direction. In one embodiment, the lateral extents of the insulating layers 32 can increase with a respective vertical distance from the top surface of the semiconductor material layer 912.

A stepped dielectric material portion 65 can be formed in the stepped cavity by deposition of a dielectric material therein. For example, a dielectric material such as silicon oxide can be deposited in the stepped cavity. Excess portions of the deposited dielectric material can be removed from above the top surface of the alternating stack (32, 42), for example, by chemical mechanical planarization (CMP). The remaining portion of the deposited dielectric material filling the stepped cavity constitutes the stepped dielectric material portion 65. If silicon oxide is employed for the stepped dielectric material portion 65, the silicon oxide of the stepped dielectric material portion 65 may, or may not, be doped with dopants such as B, P, and/or F. A non-stepped dielectric material portion 165 can be formed in the non-stepped cavity concurrently with formation of the stepped dielectric material portion 65.

Figure 3:
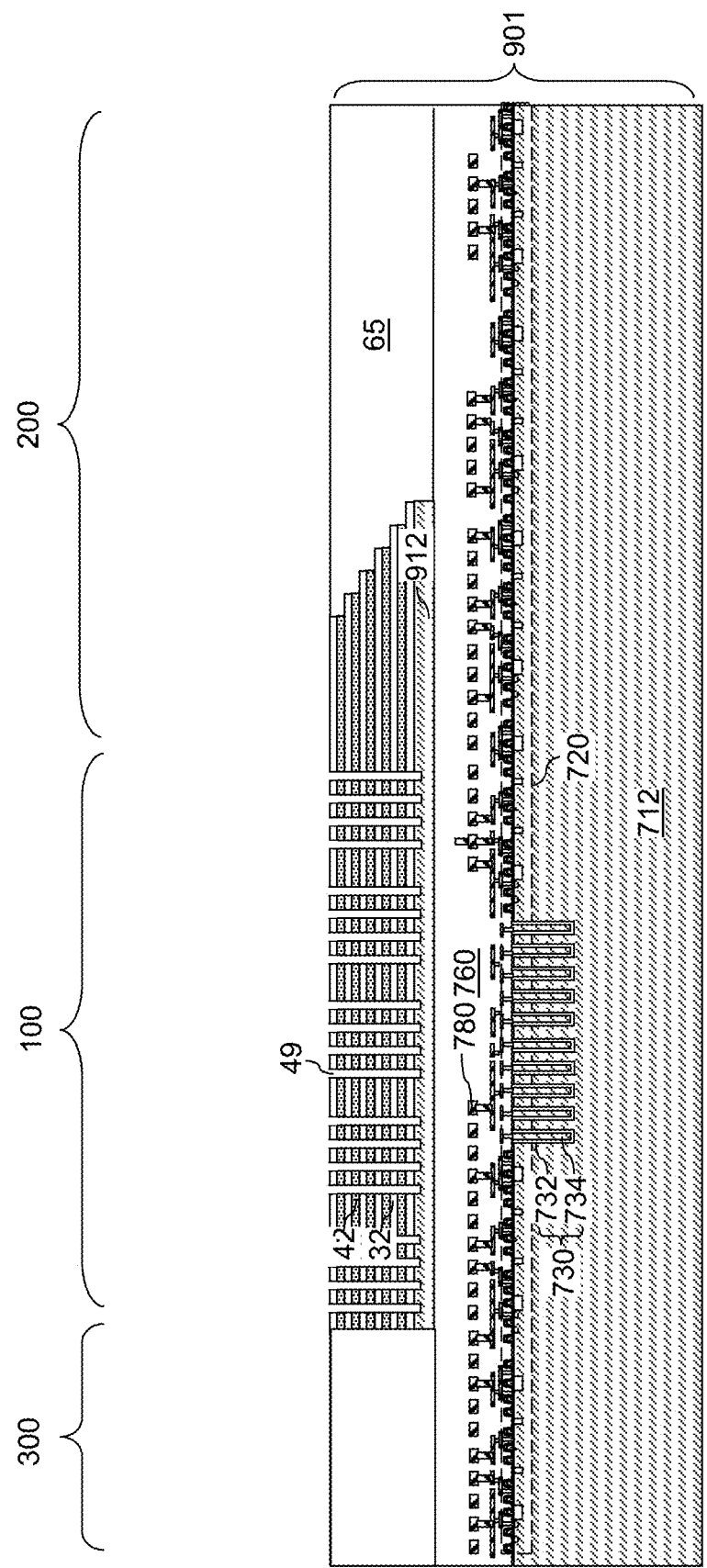
FIG. 3 is a vertical cross-sectional view of the first exemplary structure after formation of memory openings according to the first embodiment of the present disclosure.

Referring to FIG. 3, a lithographic material stack (not shown) including at least a photoresist layer can be formed over the alternating stack (32, 42) and the stepped dielectric material portion 65, and can be lithographically patterned to form openings therein. The openings include a set of openings formed over a memory array region 100 and a second set of openings formed over a connection region 200 that is adjacent to the stepped surfaces. The memory array region 100 and the connection region 200 are located within the area in which each layer of the alternating stack (32, 42) is present. The memory array region 100 can be laterally spaced from a peripheral region 300 by the connection region 200. In other words, the connection region 200 can be located between the memory array region 100 and the peripheral region 300.

The pattern in the lithographic material stack can be transferred through the alternating stack (32, 42) or the stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. As used herein, a "memory opening" refers to a structure in which memory elements, such as a memory stack structure, is subsequently formed. The memory openings 49 are formed through each layer of the alternating stack (32, 42) in the memory array region 100. Optionally, support openings (not shown) can be formed in addition to the memory openings 49. In this case, a support pillar structure (not shown) including a dielectric material or a same set of materials as a memory opening fill structure can be subsequently formed within each support opening.

The chemistry of the anisotropic etch process employed to etch through the materials of the alternating stack (32, 42) can alternate to optimize etching of the and second materials in the alternating stack (32, 42). The anisotropic etch can be, for example, a series of reactive ion etches. The sidewalls of the memory openings 49 can be substantially vertical, or can be tapered. The patterned lithographic material stack can be subsequently removed, for example, by ashing. The memory openings 49 can extend from the top surface of the alternating stack (32, 42) to at least the horizontal plane including the topmost surface of the semiconductor material layer 912. The lithographic mask stack can be subsequently removed, for example, by ashing. Each of the memory openings 49 may include a sidewall (or a plurality of sidewalls) that extends substantially perpendicular to the topmost surface of the semiconductor material layer 912. A two-dimensional array of memory openings 49 can be formed in the memory array region 100.

Figure 4H:
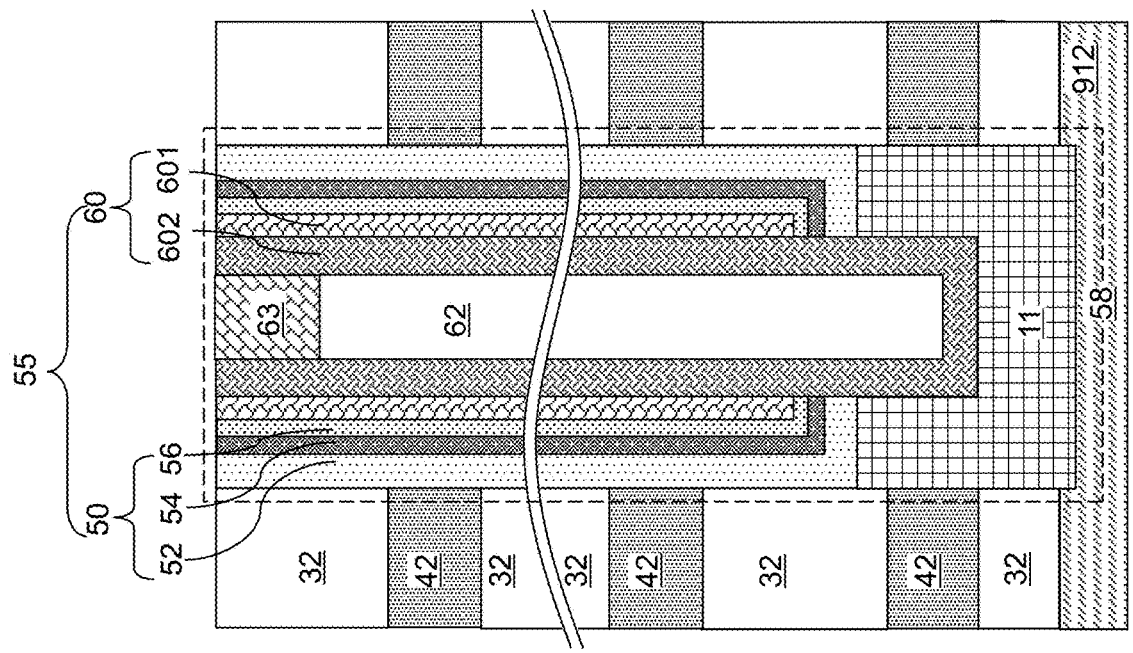

FIGS. 4A-4H illustrate structural changes in a memory opening 49, which is one of the memory openings 49 in the first exemplary structure of FIG. 3. Referring to FIG. 4A, a memory opening 49 in the exemplary device structure of FIG. 3 is illustrated. The memory opening 49 extends through the alternating stack (32, 42), and optionally into an upper portion of the semiconductor material layer 912. The recess depth of the bottom surface of each memory opening 49 with respect to the top surface of the semiconductor material layer 912 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 4B, an optional pedestal channel portion (e.g., an epitaxial pedestal) 11 can be formed at the bottom portion of each memory opening 49, for example, by selective epitaxy. Each pedestal channel portion 11 may comprise a single crystalline semiconductor material in epitaxial alignment with the single crystalline semiconductor material of the semiconductor material layer 912 in case the semiconductor material layer 912 is single crystalline. In one embodiment, the pedestal channel portion 11 can be doped with electrical dopants of the same conductivity type as the semiconductor material layer 912.

Referring to FIG. 4C, a stack of layers including a blocking dielectric layer 52, a charge storage layer 54, a tunneling dielectric layer 56, and an optional semiconductor channel layer 601 can be sequentially deposited in the memory openings 49.

Referring to FIG. 4D, the optional semiconductor channel layer 601, the tunneling dielectric layer 56, the charge storage layer 54, the blocking dielectric layer 52 are sequentially anisotropically etched employing at least one anisotropic etch process. The portions of the semiconductor channel layer 601, the tunneling dielectric layer 56, the charge storage layer 54, and the blocking dielectric layer 52 located above the top surface of the alternating stack (32, 42) can be removed by the at least one anisotropic etch process. Further, the horizontal portions of the semiconductor channel layer 601, the tunneling dielectric layer 56, the charge storage layer 54, and the blocking dielectric layer 52 at a bottom of each memory cavity 49' can be removed to form openings in remaining portions thereof. Each of the semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 912 in case the pedestal channel portions 11 are not employed) can be physically exposed underneath the opening through the semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 912 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (comprising the charge storage layer 54) that are insulated from surrounding materials by the blocking dielectric layer 52 and the tunneling dielectric layer 56. In one embodiment, the semiconductor channel layer 601, the tunneling dielectric layer 56, the charge storage layer 54, and the blocking dielectric layer 52 can have vertically coincident sidewalls.

Referring to FIG. 4E, a second semiconductor channel layer 602 can be deposited directly on the semiconductor surface of the pedestal channel portion 11 or the semiconductor material layer 912 if the pedestal channel portion 11 is omitted, and directly on the semiconductor channel layer 601. The second semiconductor channel layer 602 may partially fill the memory cavity 49' in each memory opening, or may fully fill the cavity in each memory opening. The materials of the semiconductor channel layer 601 and the second semiconductor channel layer 602 are collectively referred to as a semiconductor channel material. In other words, the semiconductor channel material is a set of all semiconductor material in the semiconductor channel layer 601 and the second semiconductor channel layer 602.

Referring to FIG. 4F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 4G:
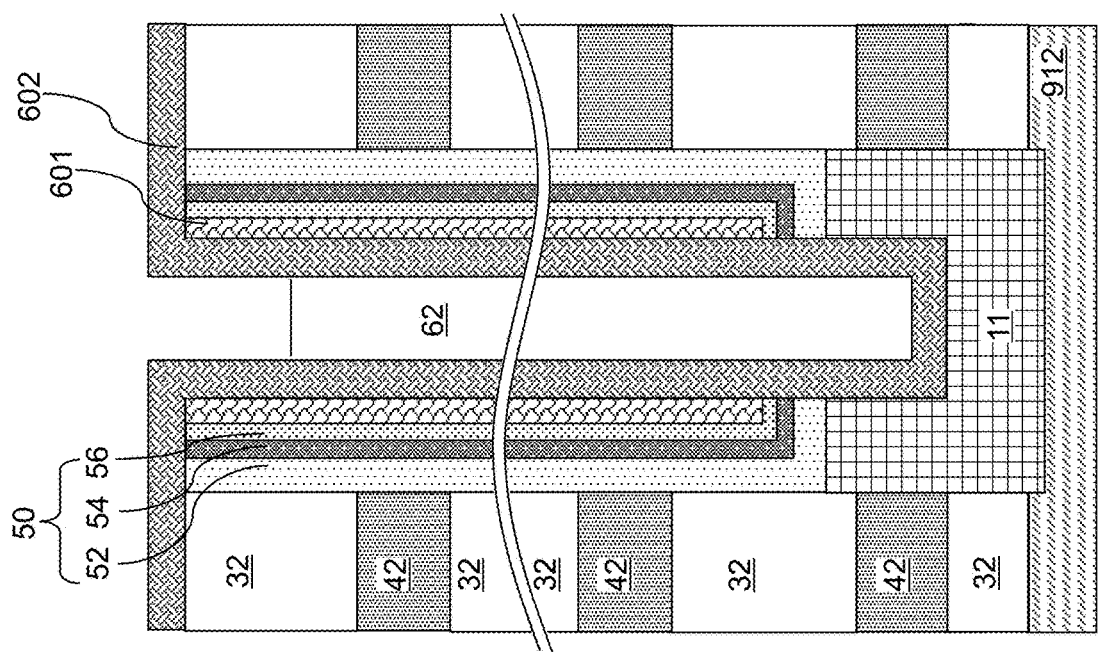

Referring to FIG. 4G, the horizontal portion of the dielectric core layer 62L can be removed, for example, by a recess etch from above the top surface of the alternating stack (32, 42). Each remaining portion of the dielectric core layer 62L constitutes a dielectric core 62. Further, the horizontal portion of the second semiconductor channel layer 602 located above the top surface of the alternating stack (32, 42) can be removed by a planarization process, which can employ a recess etch or chemical mechanical planarization (CMP).

Each adjoining pair of a semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 4H, the top surface of each dielectric core 62 can be further recessed within each memory opening, for example, by a recess etch to a depth that is located between the top surface of the alternating stack (32, 42) and the bottom surface of the alternating stack (32, 42). Drain regions 63 can be formed by depositing a doped semiconductor material within each recessed region above the dielectric cores 62. The drain regions 63 can have a doping of a second conductivity type that is the opposite of the conductivity type. For example, if the conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the alternating stack (32, 42), for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements comprising portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure 58.

Figure 5:
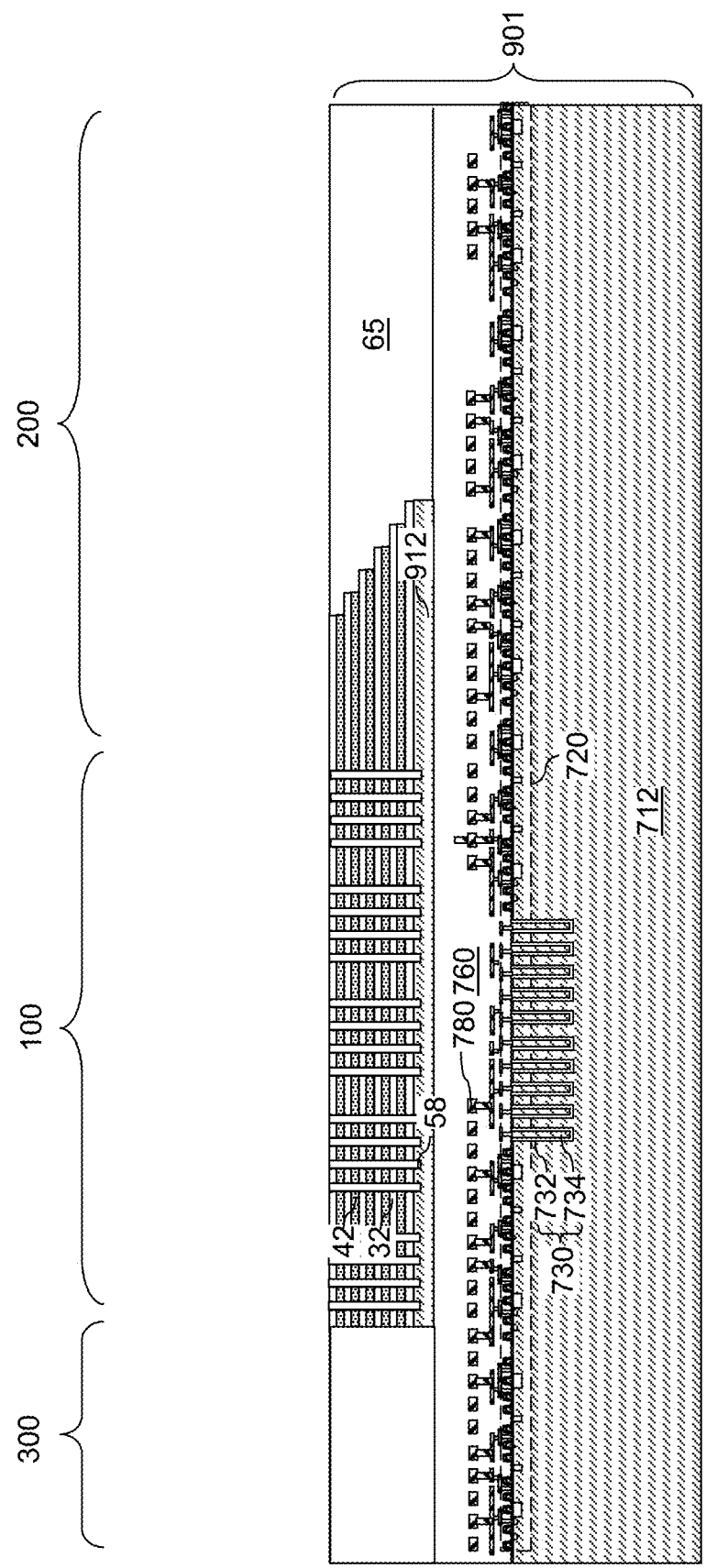
FIG. 5 is a vertical cross-sectional view of the first exemplary structure after formation of memory opening fill structures according to the first embodiment of the present disclosure.

Referring to FIG. 5, the first exemplary structure is illustrated after formation of memory opening fill structures 58 within the memory openings 49. An instance of a memory opening fill structure 58 can be formed within each memory opening 49 of the structure of FIG. 3. Each memory stack structure 55 includes a vertical semiconductor channel 60, which may comprise multiple semiconductor channel layers (601, 602) or a single semiconductor channel layer 602, and a memory film 50. The memory film 50 may comprise a tunneling dielectric layer 56 laterally surrounding the vertical semiconductor channel 60 and a vertical stack of charge storage regions (comprising portions of a charge storage layer 54) laterally surrounding the tunneling dielectric layer 56 and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Generally, the memory openings 49 vertically extending through each layer within the alternating stack (32, 42). Memory opening fill structures 58 are located in the memory openings 49. Each memory opening fill structure 58 comprises a respective vertical semiconductor channel 60 and a respective memory film 50. A three-dimensional array of memory elements is provided, which comprises portions of the memory films 50. For example, the three-dimensional array of memory elements can comprise portions of the charge storage layer 54 that are located at levels of the sacrificial material layers 42. In one embodiment, each memory elements can include a cylindrical portion of a respective charge storage layer 54 that contacts a respective sacrificial material layer 42. The semiconductor material layer 912 can comprise a semiconductor material layer 912 in electrical contact with a bottom end of each of the vertical semiconductor channels 60.

Figure 6:
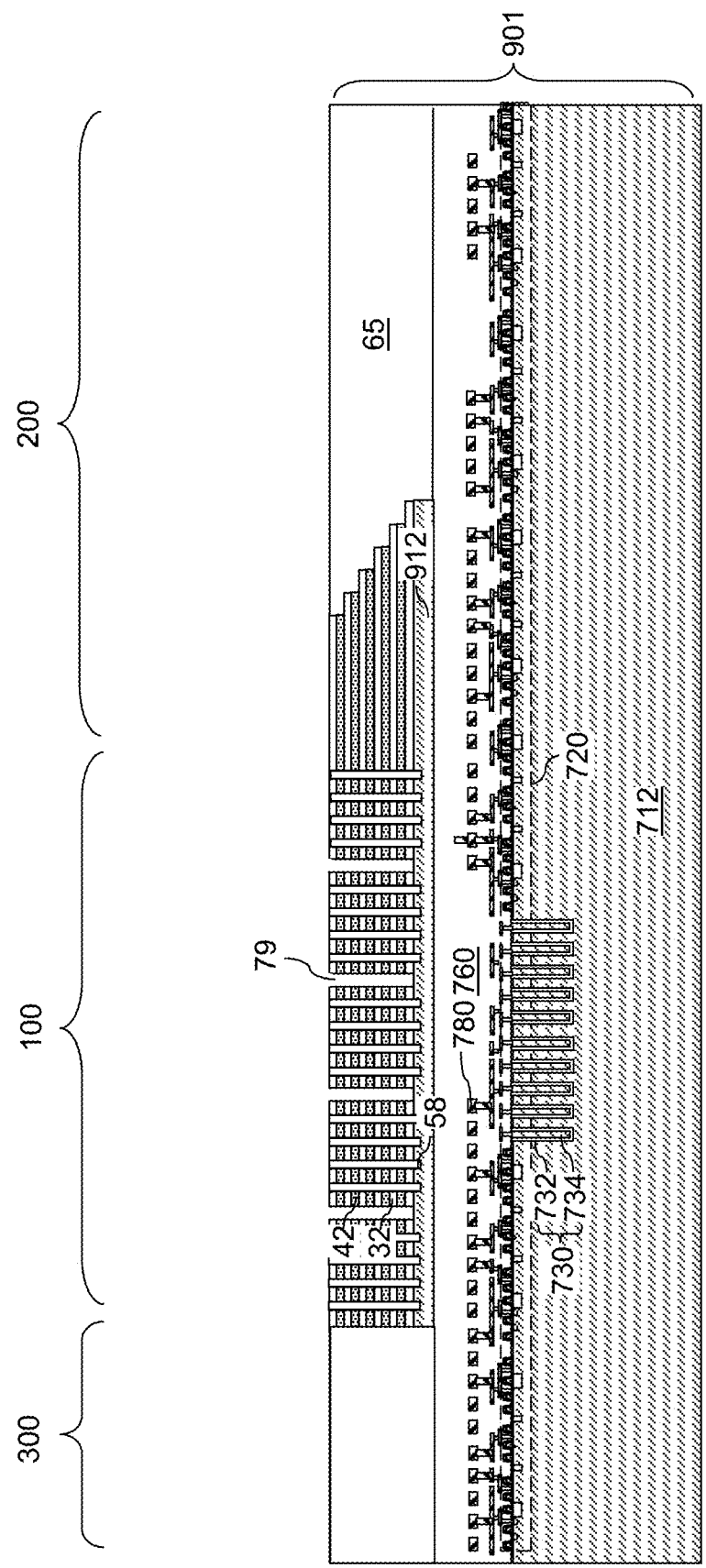
FIG. 6 is a vertical cross-sectional view of the first exemplary structure after formation of backside trenches according to the first embodiment of the present disclosure.

Referring to FIG. 6, a photoresist layer (not shown) can be applied over the alternating stack (32, 42), the stepped dielectric material portion 65, and the non-stepped dielectric material portion 165, and is lithographically patterned to form openings in areas between clusters of memory opening fill structures 58. The pattern in the photoresist layer can be transferred through the alternating stack (32, 42) and/or the stepped dielectric material portion 65 employing an anisotropic etch to form backside trenches 79, which vertically extend from the top surface of the alternating stack (32, 420)

at least to the top surface of the semiconductor material layer 912. In one embodiment, the backside trenches 79 may be laterally elongated along a horizontal direction.

Figure 7:
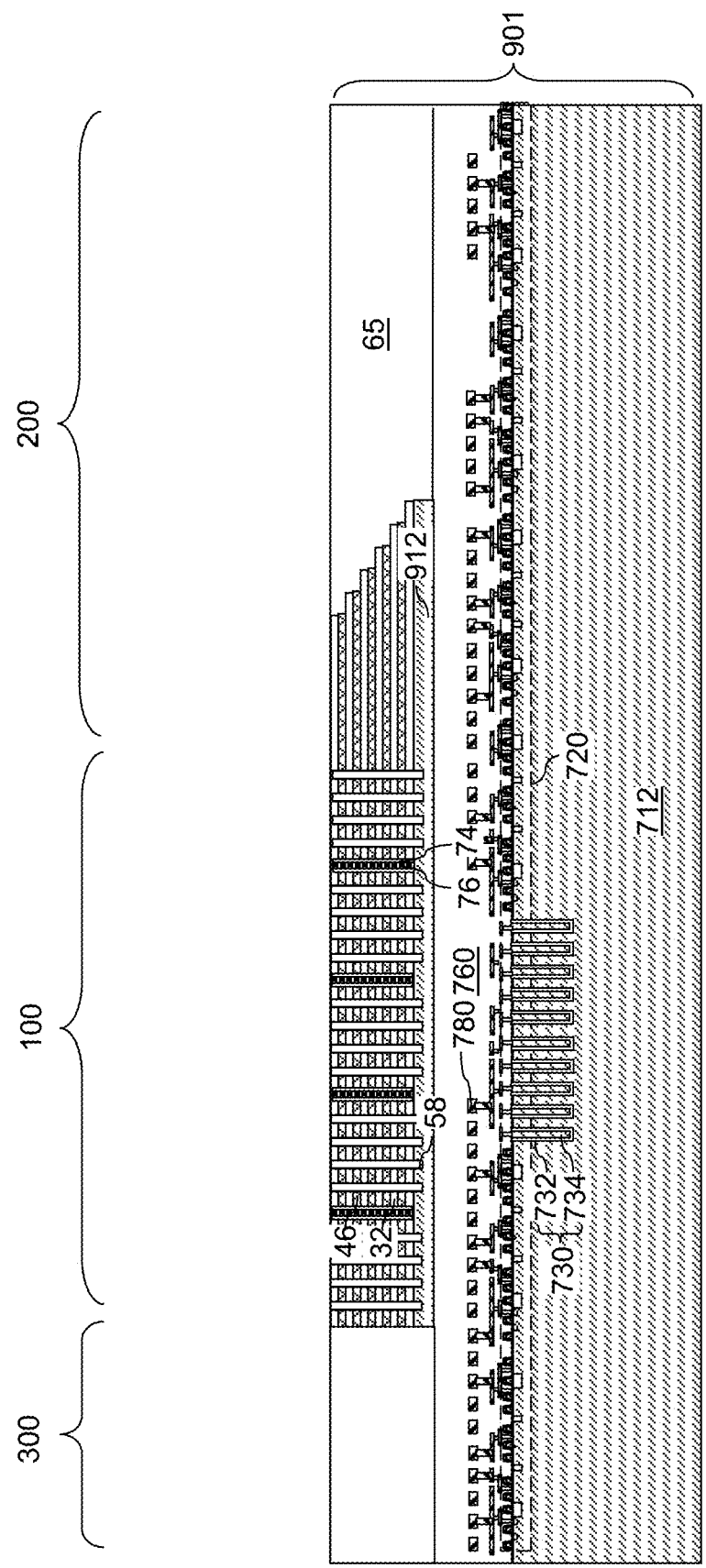
FIG. 7 is a vertical cross-sectional view of the first exemplary structure after replacement of sacrificial material layers with electrically conductive layers and formation of backside contact via structures according to the first embodiment of the present disclosure.

Referring to FIG. 7, an etchant that selectively etches the second material of the sacrificial material layers 42 with respect to the first material of the insulating layers 32 can be introduced into the backside trenches 79, for example, employing an etch process. Backside recesses are formed in volumes from which the sacrificial material layers 42 are removed. The removal of the second material of the sacrificial material layers 42 can be selective to the first material of the insulating layers 32, the material of the stepped dielectric material portion 65 and the non-stepped dielectric material portion 165, the semiconductor material of the semiconductor material layer 912, and the material of the outermost layer of the memory films 50. In one embodiment, the sacrificial material layers 42 can include silicon nitride, and the materials of the insulating layers 32, the stepped dielectric material portion 65, and the non-stepped dielectric material portion 165 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The stepped dielectric material portion 65 and the memory opening fill structures 58 provide structural support while the backside recesses are present within volumes previously occupied by the sacrificial material layers 42.

Each backside recess can be a laterally extending cavity having a lateral dimension that is greater than the vertical extent of the cavity. In other words, the lateral dimension of each backside recess can be greater than the height of the backside recess. A plurality of backside recesses can be formed in the volumes from which the second material of the sacrificial material layers 42 is removed. The memory openings in which the memory stack structures 55 are formed are herein referred to as front side openings or front side cavities in contrast with the backside recesses. In one embodiment, the memory array region 100 comprises an array of monolithic three-dimensional NAND strings having a plurality of device levels disposed above the semiconductor material layer 912. In this case, each backside recess can define a space for receiving a respective word line of the array of monolithic three-dimensional NAND strings.

Each of the plurality of backside recesses can extend substantially parallel to the top surface of the semiconductor material layer 912. A backside recess can be vertically bounded by a top surface of an underlying insulating layer 32 and a bottom surface of an overlying insulating layer 32. In one embodiment, each backside recess can have a uniform height throughout. Physically exposed surface portions of the optional pedestal channel portions 11 and the semiconductor material layer 912 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer, and to convert each physically exposed surface portion of the semiconductor material layer 912 into a planar dielectric portion.

A backside blocking dielectric layer (not shown) can be optionally formed. At least one metallic material can be deposited in the backside recesses by at least one conformal deposition process. For example, a combination of a metallic barrier layer and a metallic fill material can be deposited in the backside recesses. The metallic barrier layer includes an electrically conductive metallic material that can function as a diffusion barrier layer and/or adhesion promotion layer for the metallic fill material. The metallic barrier layer can include a conductive metallic nitride material such as TiN, TaN, WN, or a stack thereof, or can include a conductive metallic carbide material such as TiC, TaC, WC, or a stack thereof. The metal fill material is deposited in remaining volumes of backside recesses, on the sidewalls of the at least one the backside trench 79, and over the top surface of the topmost insulating layer 32. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum.

Portions of the at least one conductive material deposited at peripheral regions of the backside trenches 79 or above the topmost insulating layer 32 can be removed by an isotropic etch back process. Each remaining portion of the deposited metallic material in the backside recesses constitutes an electrically conductive layer 46. Each electrically conductive layer 46 can be a conductive line structure. Thus, the sacrificial material layers 42 are replaced with the electrically conductive layers 46, and an alternating stack of the insulating layers 32 and the electrically conductive layers 46 is formed.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

A conformal insulating material layer including an insulating material can be deposited in the backside trenches 79, and can be anisotropically etched to form insulating spacers 74. The insulating spacers 74 include insulating spacers 74 that are formed at peripheral portions of the backside trenches 79. The insulating spacers 74 include an insulating material such as silicon oxide, silicon nitride, silicon oxynitride, and/or a dielectric metal oxide. The insulating spacers 74 may have a lateral thickness in a range from 10 nm to 100 nm, such as from 20 nm to 50 nm, although lesser and greater lateral thicknesses may also be employed. Source regions (not shown) may be formed at the bottom of each backside trench 79 by implantation of dopants of a second conductivity type, which is the opposite of the conductivity type. For example, if the conductivity type is p-type, the second conductivity type is n-type, and vice versa.

At least one conductive material can be deposited in remaining volumes of the backside trenches 79. The at least one conductive material can include, for example, a combination of a metallic barrier layer and a metallic fill material. The metallic barrier layer includes an electrically conductive metallic material that can function as a diffusion barrier layer and/or adhesion promotion layer for the metallic fill material. The metallic barrier layer can include a conductive metallic nitride material such as TiN, TaN, WN, or a stack thereof, or can include a conductive metallic carbide material such as TiC, TaC, WC, or a stack thereof. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. Excess portions of the at least one conductive material can be removed from above the horizontal plane including the top surface of the alternating stack (32, 46) by a planarization process such as a chemical mechanical planarization process. Each remaining portion of the at least one conductive material filling a backside trench 79 constitutes a backside contact via structure 76, which can contact a top surface of a respective source region embedded in the semiconductor material layer 912.

Alternatively, at least one dielectric material, such as silicon oxide, may be conformally deposited in the backside trenches 79 by a conformal deposition process. Each portion of the deposited dielectric material that fills a backside trench 79 constitutes a backside trench fill structure. In this case, each backside trench fill structure may fill the entire volume of a backside trench 79 and may consist essentially of at least one dielectric material. In this alternative embodiment, a horizontal source line (e.g., direct strap contact) may contact an side of the lower portion of the semiconductor channel 60.

Figure 8:
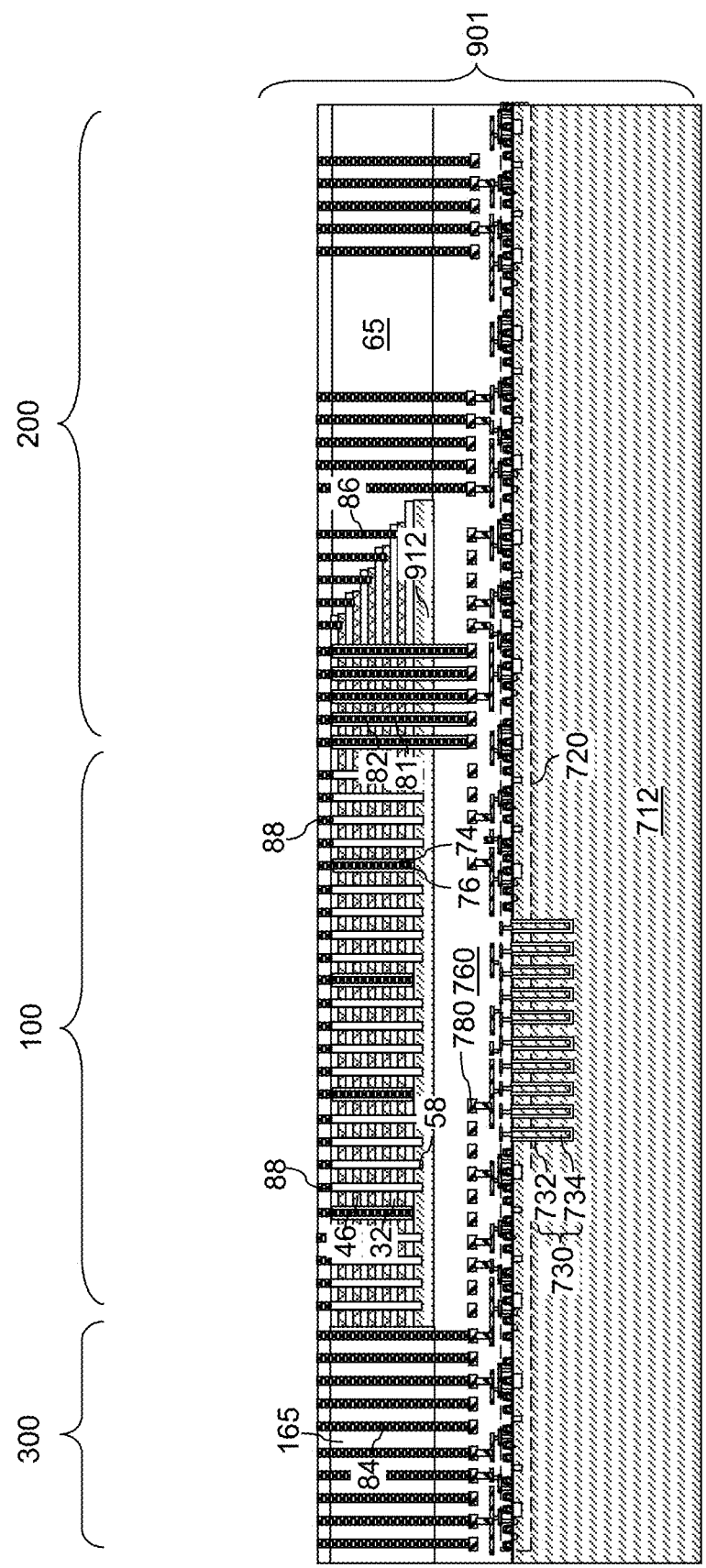
FIG. 8 is a vertical cross-sectional view of the first exemplary structure after formation of a contact-level dielectric layer and various contact via structures according to the first embodiment of the present disclosure.

Referring to FIG. 8, a contact-level dielectric layer 70 can be deposited over the alternating stack (32, 46), the stepped dielectric material portion 65, and the non-stepped dielectric material portion 165. The contact-level dielectric layer 70 includes a dielectric material such as silicon oxide. The thickness of the contact-level dielectric layer 70 can be in a range from 100 nm to 600 nm, although lesser and greater thicknesses can also be employed.

Various via cavities can be applied through the contact-level dielectric layer 70 and underlying dielectric material portions such as the stepped dielectric material portion 65, the non-stepped dielectric material portion 165, upper portions of the first proximal dielectric material layers 760, and optionally through the first alternating stack of the first insulating layers 32 and the first electrically conductive layers 46 (which function as word lines and select lines).

In case some contact via cavities are formed through the first alternating stack (32, 46), insulating liners 81 may be formed on physically exposed sidewalls of the first alternating stack (32, 46), for example, by conformally depositing and anisotropically etching a continuous insulating liner layer such as a silicon oxide liner layer. At least one conductive material can be deposited in the various contact via cavities. The at least one conductive material can include, for example, a combination of a metallic barrier layer and a metallic fill material. Excess portions of the at least one conductive material can be removed from above the horizontal plane including the top surface of the contact-level dielectric layer 70. Remaining portions of the at least one conductive material filling the contact via cavities constitute various contact via structures (88, 82, 84).

The contact via structures (88, 82, 84) can include drain contact via structures 88 contacting a respective drain region 63, optional through-stack contact via structures 82 vertically extending through the alternating stack (32, 46), and through-dielectric contact via structures 84 that vertically extends through the stepped dielectric material portion 65 or through the non-stepped dielectric material portion 165. The through-stack contact via structures 82 and the through-dielectric contact via structures 84 can contact a respective one of the first proximal metal interconnect structures 780 that are embedded within the first proximal dielectric material layers 760.

Figure 9:
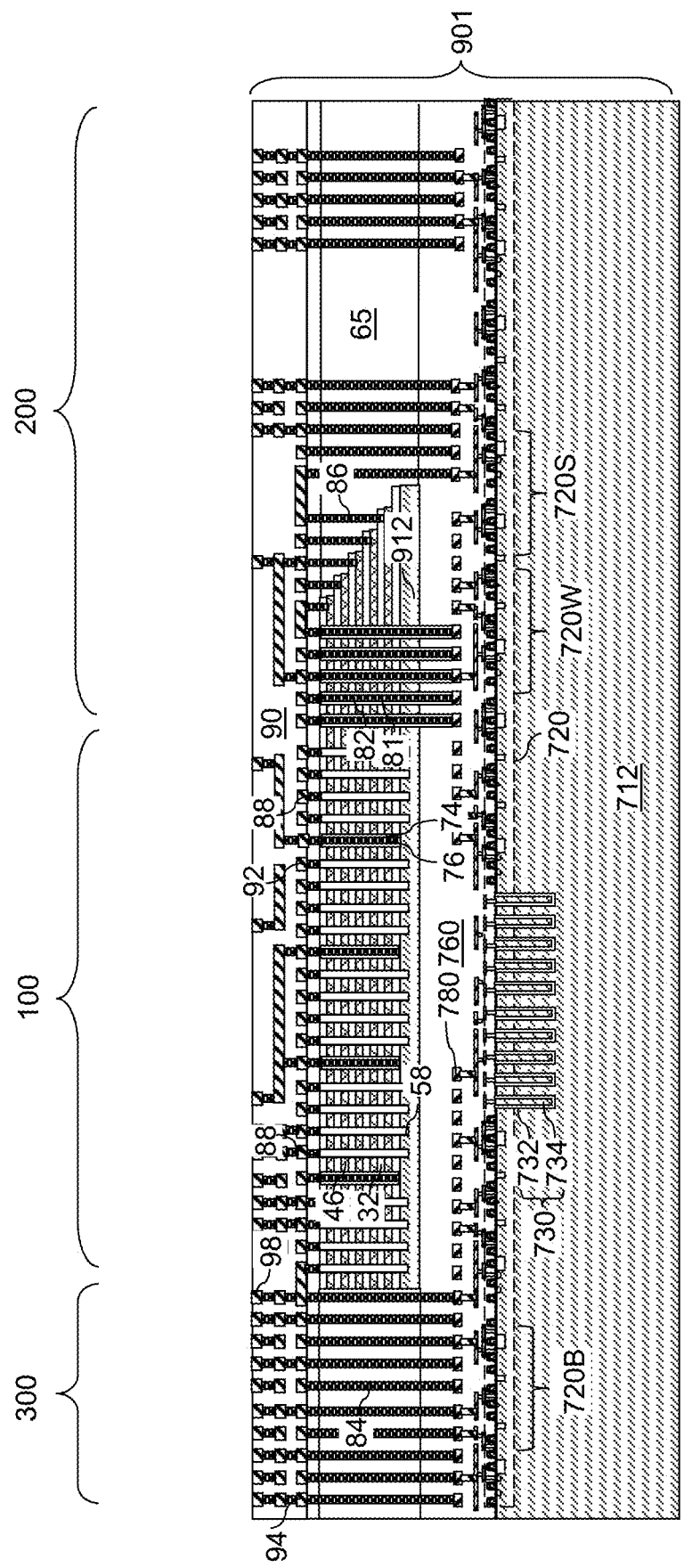
FIG. 9 is a vertical cross-sectional view of the first exemplary structure after formation of first metal interconnect structures and first interconnect-side bonding pads embedded in first dielectric material layers according to the first embodiment of the present disclosure.

Referring to FIG. 9, first distal dielectric material layers 90 are formed over the contact-level dielectric layer 70. Bit lines 92 and distal metal interconnect structures 94 are formed in the first distal dielectric material layers 90. First metal bonding pads 98 are formed in the topmost layer of the first distal dielectric material layers 90.

The memory stack structures 55 extending through the first alternating stack of first insulating layers 32 and the first electrically conductive layers 46 are herein referred to as first memory stack structures 55. Each first memory stack structure 55 comprises a respective first vertical semiconductor channel 60 and a respective first vertical stack of memory elements (such as a memory film 50 including portions of a charge storage layer 54 located at levels of the first electrically conductive layers 46).

The first three-dimensional memory array comprises first bit lines 92. The first bit lines 92 are electrically connected to a first end of a respective subset of the first vertical semiconductor channels 60. For example, each of the first bit lines 92 can contact top surfaces of a respective subset of the drain contact via structures 88. The first peripheral circuit 720 comprises a first bit line driver circuit 720B having first bit line driver output nodes electrically connected to a first subset of the first bit lines 92. Generally, a first semiconductor die 901 can be provided, which comprises a first three-dimensional memory array including a first alternating stack of first insulating layers 32 and first electrically conductive layers 46 and first memory stack structures 55 vertically extending through the first alternating stack (32, 46), a first peripheral circuit 720 comprising a first word line driver circuit 720W, and first dielectric material layers (760, 90) embedding first metal interconnect structures (780, 92) and first metal bonding pads 98.

Figure 10:
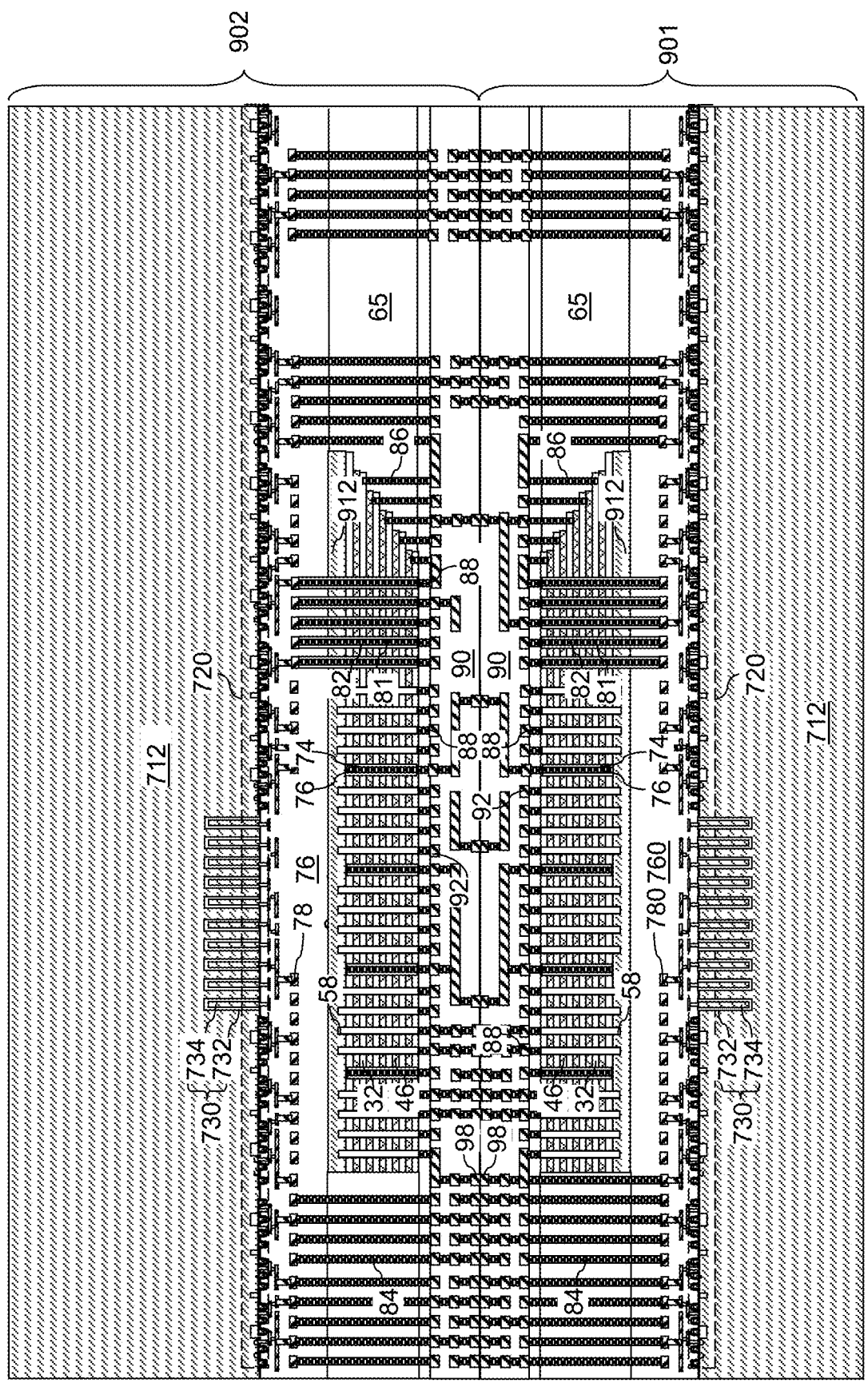
FIG. 10 is a vertical cross-sectional view of the first exemplary structure after bonding a first semiconductor die of FIG. 9 with a second semiconductor die according to the first embodiment of the present disclosure.

Referring to FIG. 10, a second semiconductor die 902 can be provided, which can be derived from the first semiconductor die 901 by changing the pattern of the metal bonding pads 98. Specifically, the pattern of second metal bonding pads 98 in the second semiconductor die 902 can be a mirror image pattern of the pattern of the first metal bonding pads 98 in the first semiconductor die 901.

The second semiconductor die 902 comprises a second three-dimensional memory array including a second alternating stack of second insulating layers 32 and second electrically conductive layers 46 and second memory stack structures 55 vertically extending through the second alternating stack (32, 46). The second semiconductor die 902 comprises a second peripheral circuit 720 including a second word line driver circuit 720W, second select line driver circuit 720S and second bit line driver circuit 720B, and second dielectric material layers (760, 90) embedding second proximal metal interconnect structures 780 and second metal bonding pads 98.

According to an aspect of the present disclosure, the second word line driver circuit 720W comprises second word line switching transistors and output nodes that are configured to be subsequently electrically connected to a second subset of the first electrically conductive layers 46 (e.g., word lines) in the first three-dimensional memory array in the first semiconductor die 901, and electrically connected to a second subset of the second electrically conductive layers 46 in the second three-dimensional memory array in the second semiconductor die 902.

In one embodiment, the second select line driver circuit 720S output nodes may include second source-side select line driver output nodes that are electrically connected to source-side select lines among the second electrically conductive layers 46 of the second three-dimensional memory array. In one embodiment, the second select line driver circuit 720S output nodes may also include second drain-side select line driver output nodes that are electrically connected to drain-side select lines among the second electrically conductive layers 46 of the second three-dimensional memory array.

In one embodiment, the second bit line driver circuit 720B has second bit line driver output nodes configured to be electrically connected to, and to drive, a second subset of the first bit lines in the first three-dimensional memory array in the first semiconductor die 901 and a second subset of the second bit lines in the second three-dimensional memory array in the second semiconductor die 902. In this embodiment, the bit lines 92 of the first and second semiconductor die (901, 902) are electrically connected to each other. In an alternative embodiment, the second bit line driver circuit 720B may second bit line driver output nodes configured to be electrically connected to, and to drive, only the second bit lines in the second three-dimensional memory array in the second semiconductor die 902. In this alternative embodiment, the bit lines 92 of the first and second semiconductor die (901, 902) are not electrically connected to each other.

The second semiconductor die 902 can be aligned to the first semiconductor die 901, and can be subsequently boned to each other. Generally, a plurality of first semiconductor dies 901 can be provided within a first wafer, and a plurality of second semiconductor dies 902 can be provided within a second wafer. The plurality of first semiconductor dies 901 can be bonded to the plurality of second semiconductor dies 902 by wafer-to-wafer bonding. Specifically, each set of second metal bonding pads 98 within a second semiconductor die 902 can be bonded to a respective set of first metal bonding pads 98 in a first semiconductor die 901 that is bonded to the second semiconductor die 902.

The first peripheral circuit 720 comprises a first word line driver circuit 720W having first word line driver output nodes electrically connected to a first subset of the first electrically conductive layers 46 and electrically connected to a first subset of the second electrically conductive layers 46 through a first subset of mating pairs of the first metal bonding pads 98 and the second metal bonding pads 98. The second peripheral circuit 720 comprises a second word line driver circuit 720W having second word line driver output nodes electrically connected to a second subset of the first electrically conductive layers 46 through a second subset of the mating pairs of the first metal bonding pads 98 and the second metal bonding pads 98 and electrically connected to a second subset of the second electrically conductive layers 46.

Figure 11:
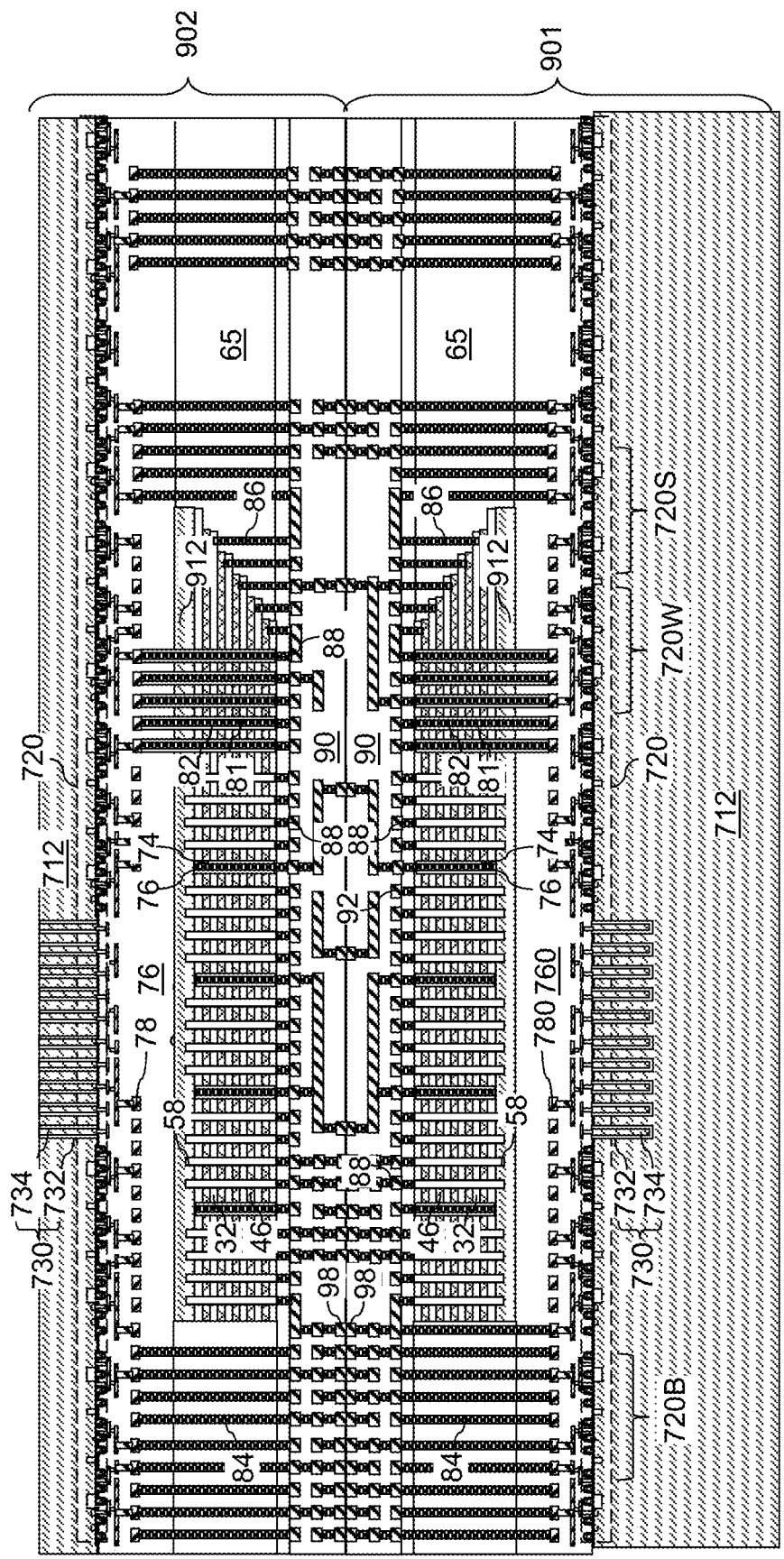
FIG. 11 is a vertical cross-sectional view of the first exemplary structure after thinning a second substrate from the backside according to the first embodiment of the present disclosure.

Referring to FIG. 11, the first substrate 712 or the second substrate 712 may be thinned. For example, the backside of the second substrate 712 can be thinned, for example, by grinding, polishing, an anisotropic etch process, and/or an isotropic etch process. In one embodiment, the second substrate 712 can be thinned until surfaces of the laterally-isolated through-substrate via structures 734 are physically exposed. The through-substrate connection structures 730 can vertically extend through the thinned second substrate 712. Each through-substrate connection structure 730 can include a laterally-isolated through-substrate via structure 734 and a substrate insulating spacer 732.

Figure 12:
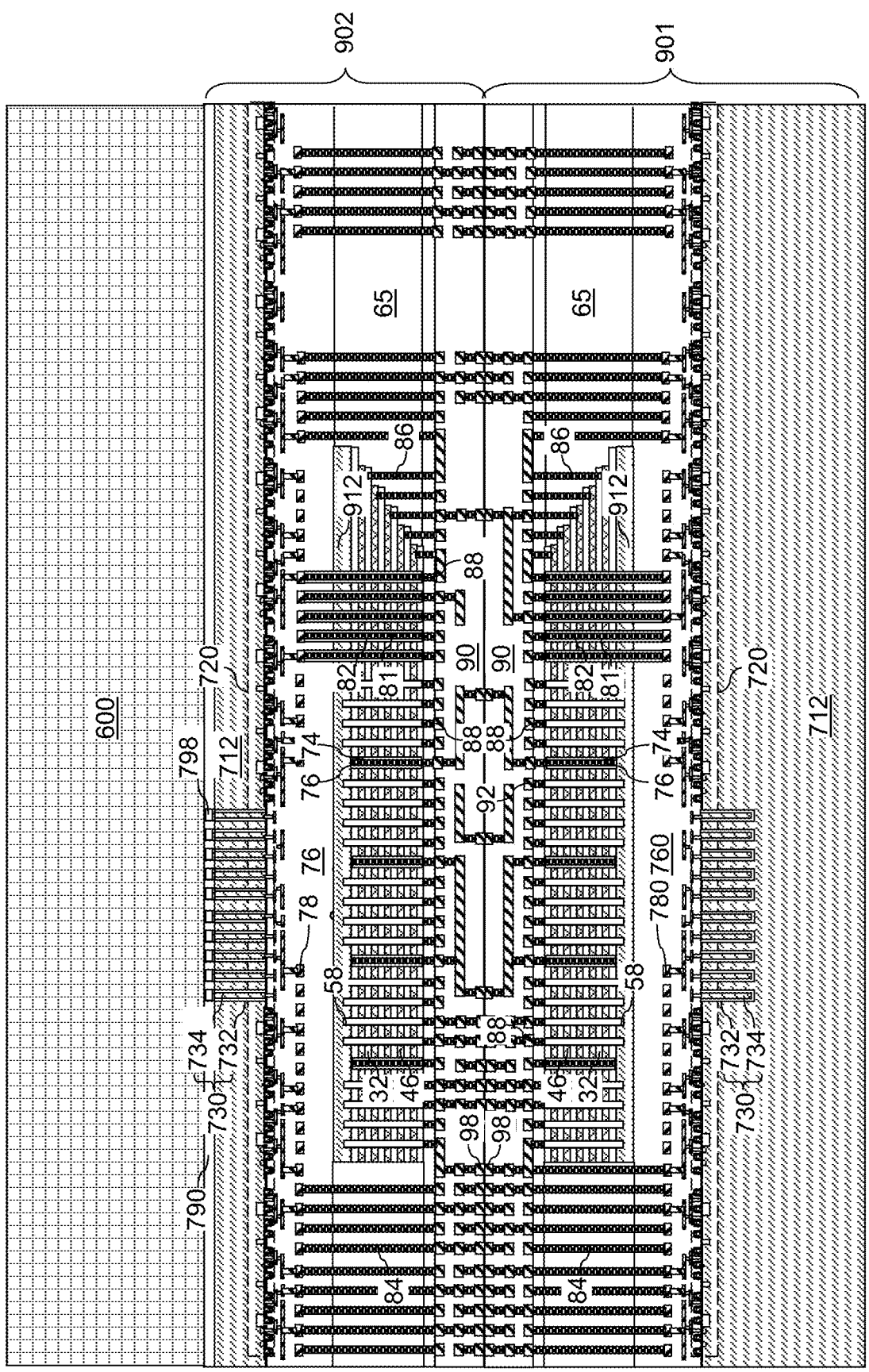
FIG. 12 is a vertical cross-sectional view of the first exemplary structure after attaching a handle substrate to the thinned substrate according to the first embodiment of the present disclosure.

Referring to FIG. 12, a second backside dielectric material layer 790 can be formed on the backside of the second substrate 712, and second backside bonding pads 798 can be formed in the second backside dielectric material layer 790. Each second backside bonding pads 798 can be formed directly on a respective one of the laterally-isolated through-substrate via structure 734. A handle substrate 600 can be attached to the second semiconductor die 902.

Figure 13:
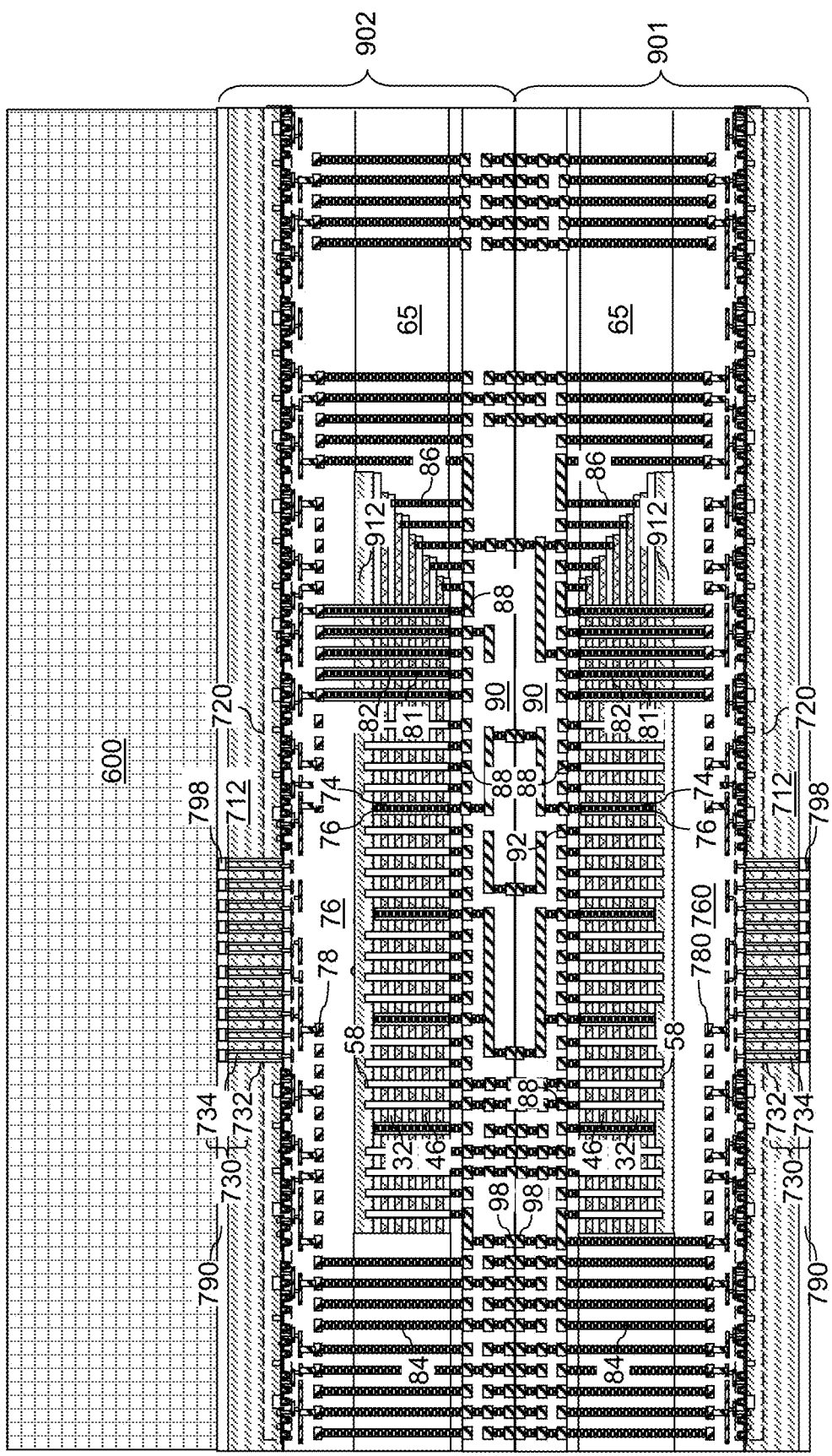
FIG. 13 is a vertical cross-sectional view of the first exemplary structure after thinning the second substrate according to the first embodiment of the present disclosure.

Referring to FIG. 13, the backside of the first substrate 712 can be thinned, for example, by grinding, polishing, an anisotropic etch process, and/or an isotropic etch process. For example, the first substrate 712 can be thinned until surfaces of the laterally-isolated through-substrate via structures 734 are physically exposed. The through-substrate connection structures 730 can vertically extend through the thinned first substrate 712. Each through-substrate connection structure 730 can include a laterally-isolated through-substrate via structure 734 and a substrate insulating spacer 732. A first backside dielectric material layer 790 can be formed on the backside of the first substrate 712, and first backside bonding pads 798 can be formed in the first backside dielectric material layer 790. Each first backside bonding pads 798 can be formed directly on a respective one of the laterally-isolated through-substrate via structure 734.

Figure 14:
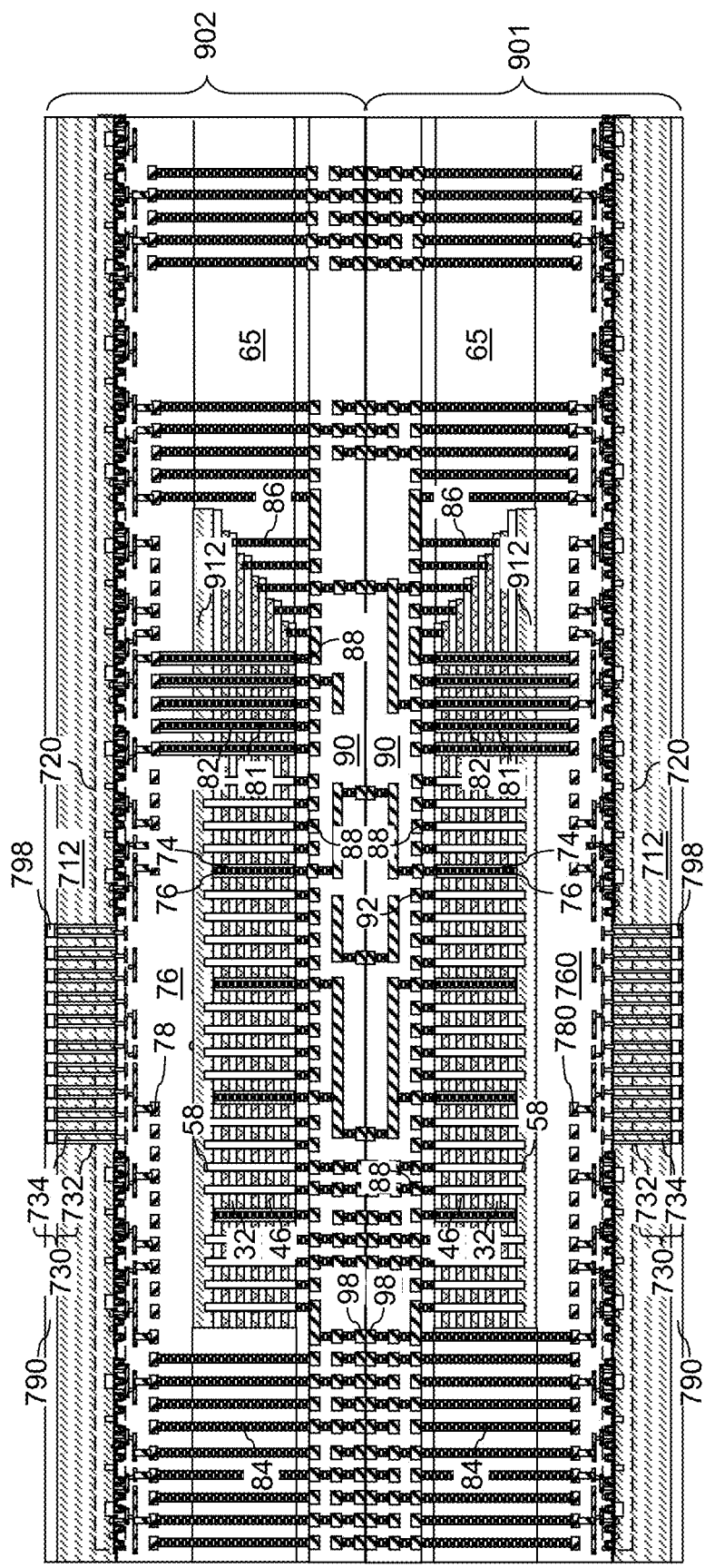
FIG. 14 is a vertical cross-sectional view of the first exemplary structure after detaching the handle substrate according to the first embodiment of the present disclosure.
Figure 15:
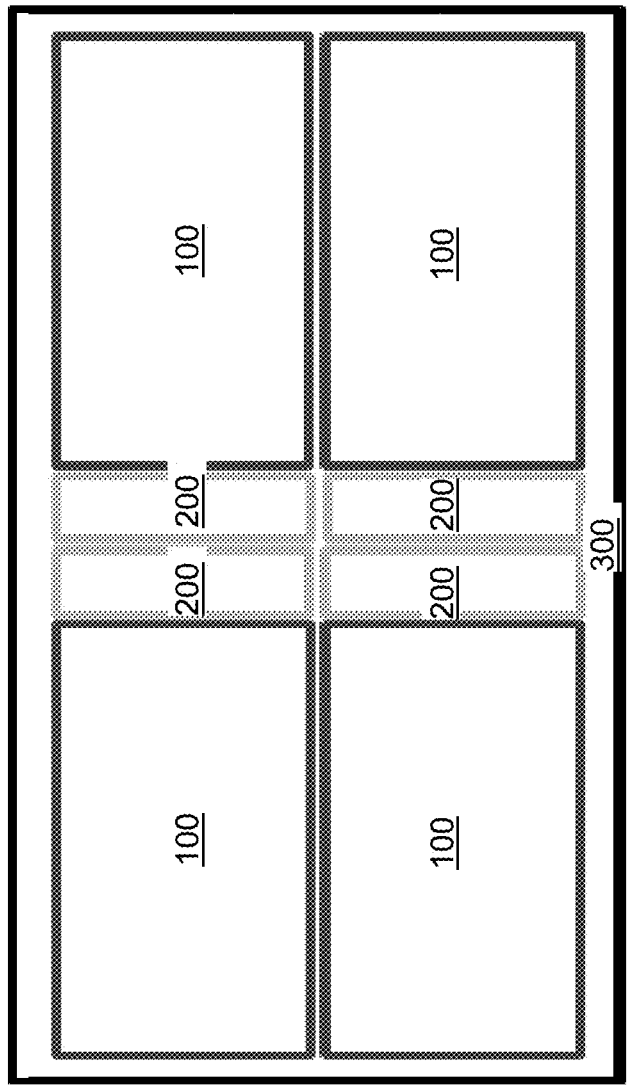
FIG. 15 is a plan view of the first exemplary structure of FIG. 14 according to the first embodiment of the present disclosure.
Figure 16A:
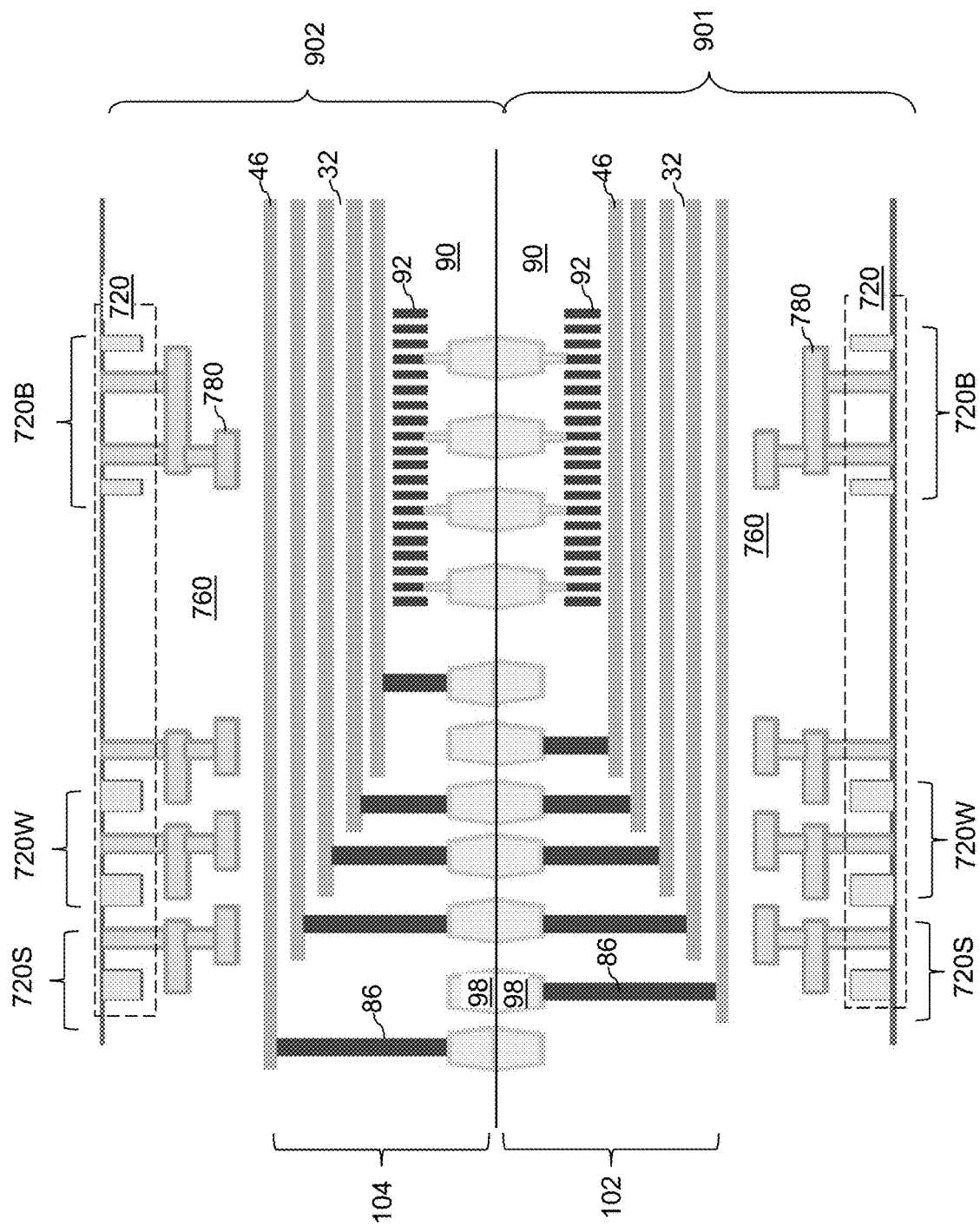
FIG. 16A is a schematic vertical cross-sectional view of the first exemplary structure of FIGS. 14 and 15.

Referring to FIGS. 14, 15 and 16A, the handle substrate 600 can be detached from the second substrate 902.

Generally, the first metal bonding pads 98 and/or the first backside bonding pads 798 of the first semiconductor die 901 may be employed for bonding, and the second metal bonding pads 98 or the second backside bonding pads 798 of the second semiconductor die 902 may be employed for bonding. Thus, the first stepped surfaces of the first alternating stack (32, 46) that contact the first retro-stepped dielectric material portion 65 of the first semiconductor die 901 may be oriented toward, or away from, the second semiconductor die 902, and the second stepped surfaces of the second alternating stack (32, 46) that contact the second retro-stepped dielectric material portion 65 of the second semiconductor die 902 may be oriented toward, or away from, the first semiconductor die 901.

Figure 16B:
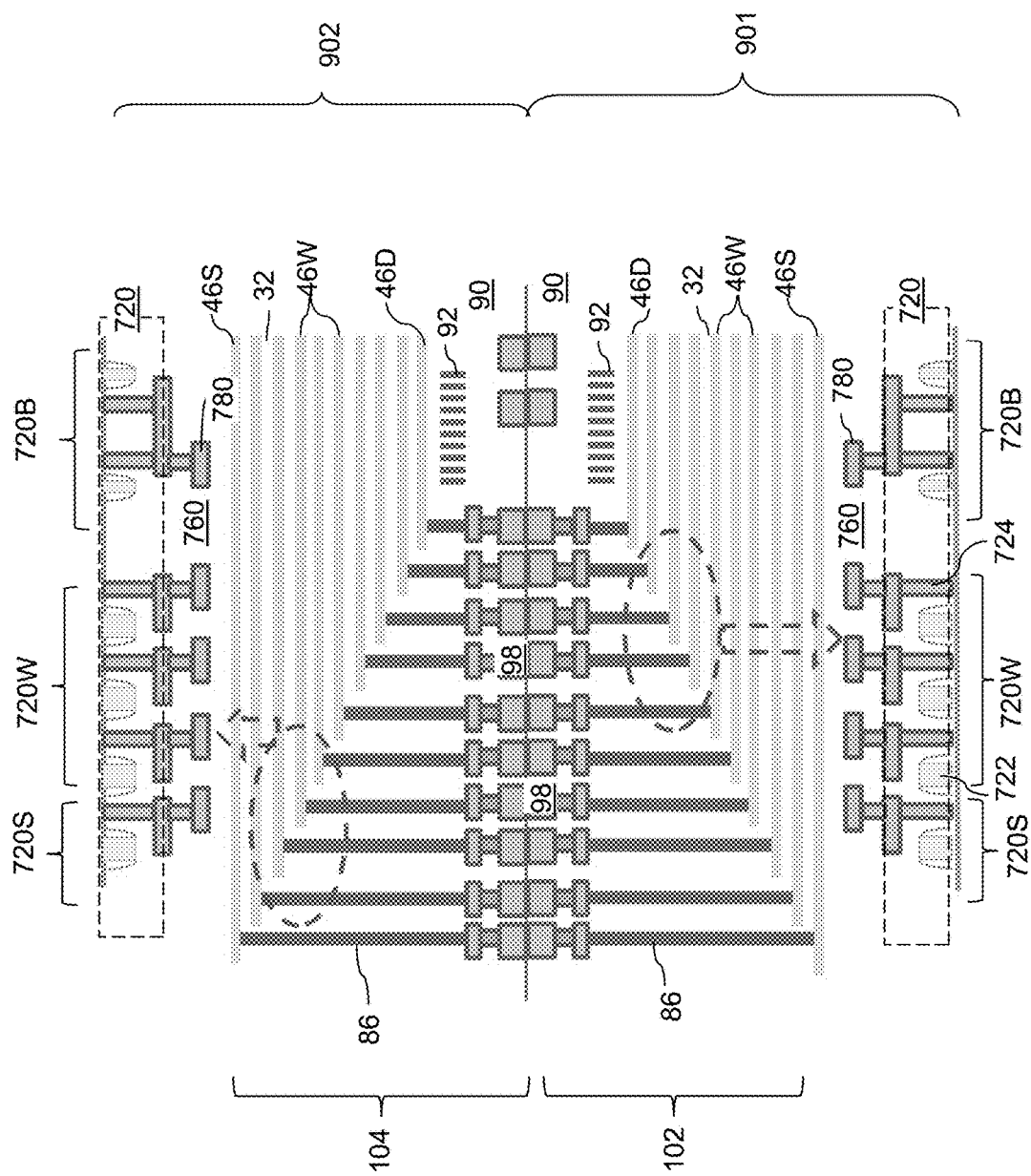
FIG. 16B is a schematic vertical cross-sectional view of an alternative configuration of the first exemplary structure.

Referring to FIG. 16B, an alternative configuration of the first exemplary structure can be derived from the configuration of FIG. 16A by not electrically connecting the respective bit lines 92 of the bonded semiconductor die (901, 902). In the configuration of FIG. 16B, the bit lines 92 of each semiconductor die (901, 902) are electrically connected to and are driven by the bit line driver circuit 720B on the same respective semiconductor die (901, 902).

As shown in FIG. 16B, the respective word lines 46W in each semiconductor die (901, 902) are electrically connected to each other through contact via structures 86 and bonding pads 98. One set of word lines 46W (e.g., the word lines closer to the drain-side select lines 46D) in both semiconductor dies (901, 902) are electrically connected to the word line driver circuit 720W in the first semiconductor die 901, as shown by the lower dashed circle and arrow. Another set of word lines 46W (e.g., the word lines closer to the source-side select lines 46S) in both semiconductor dies (901, 902) are electrically connected to the word line driver circuit 720W in the second semiconductor die 902, as shown by the upper dashed circle and arrow.

Thus, "n" effective word lines in the two semiconductor die (901, 902) are split into n/2 word line parts 46W located in the first semiconductor die 901 and n/2 word line parts 46W located in the second semiconductor die 902. However, the respective word lines parts (e.g., word lines 46W having the same number counting from the source-side select line in each die) are electrically connected to each other and are driven by the same word line switching transistor of the word line driver circuit 720W in one of the two semiconductor die. Thus, each word line driver circuit 720W of each semiconductor die effectively drives n/2 word lines due to the electrical connection of the respective word lines. This reduces the total area of the word line driver circuits 720W in half compared to having n word lines in one semiconductor die being driven separately by a word line driver circuit in the same semiconductor die. Furthermore, this permits the peripheral region 300 to be increased (e.g., doubled). The word line effective length becomes double (i.e., each effective word line has a first part 46W in the first semiconductor die 901 and the second part 46W in the first semiconductor die 902 electrically connected together by the contact via structure 96). This causes the page size to also double in size. The number of planes may also be reduced (e.g., by half).

In a split select line driver configuration shown in FIG. 16A, the select lines (46S, 46D) in one semiconductor die may be electrically connected to the select line driver circuit 720S in the same semiconductor die. Thus, the select lines (e.g., source-side select lines 46S and drain-side select lines 46D) in each semiconductor die (901, 902) are separately electrically connected to the select line driver circuit 720S in their respective semiconductor die. In this configuration, each select line driver circuit 720S includes output nodes that are configured to be electrically connected to the select lines of the second three-dimensional memory array in the same semiconductor die, and to be electrically isolated from each of the electrically conductive layers of the three-dimensional memory array in the other semiconductor die.

In a non-split select line driver configuration shown in FIG. 16B, the select lines (46S, 46D) in one semiconductor die may be electrically connected to the select line driver circuit 720S in the same semiconductor die or in the other semiconductor die. The connections may be configured to optimize the speed of the device.

Figure 17:
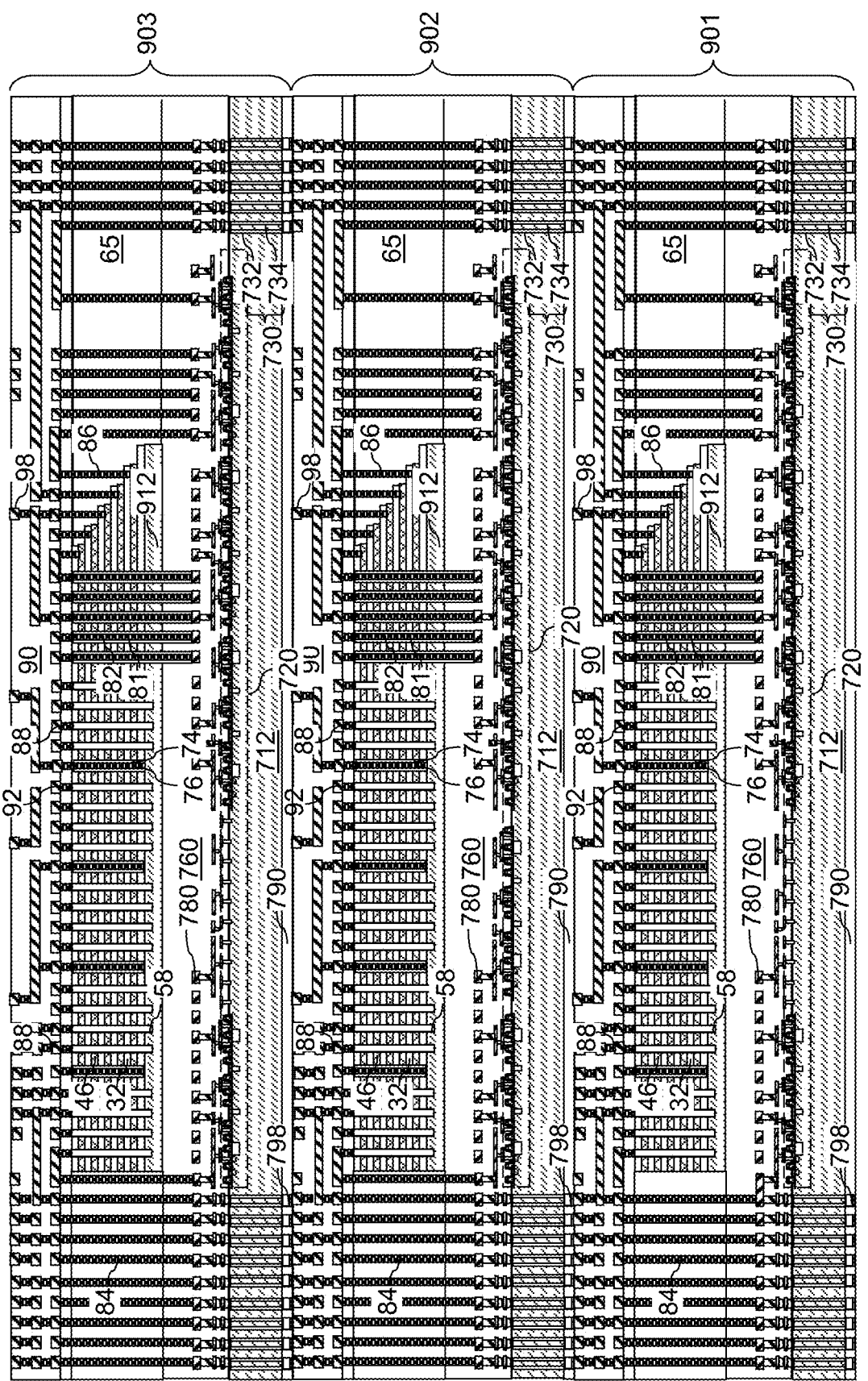
FIG. 17 is a vertical cross-sectional view of a first alternative embodiment of the first exemplar structure according to the first embodiment of the present disclosure.

Referring to FIG. 17, a first alternative embodiment of the first exemplary structure is illustrated, in which a bonded assembly comprises a first semiconductor die 901, a second semiconductor die 902, and a third semiconductor die. The word line drivers of the peripheral circuits 720 can be interconnected across the bonding interfaces of the semiconductor dies (901, 902, 903) through mating pairs of bonding pads (98, 798). For example, first word line drivers 720W of the first peripheral circuit 720 in the first semiconductor die 901 drive a first subset of first word lines (which are a first subset of the first electrically conductive layers 46) in the first semiconductor die 901, a first subset of second word lines (which are a first subset of the second electrically conductive layers 46) in the second semiconductor die 902, and a first subset of third word lines (which are a first subset of the third electrically conductive layers 46) in the third semiconductor die 903. Second word line drivers 720W of the second peripheral circuit 720 in the second semiconductor die 902 drive a second subset of the first word lines (which are the first subset of the first electrically conductive layers 46) in the first semiconductor die 901, a second subset of the second word lines (which are the first subset of the second electrically conductive layers 46) in the second semiconductor die 902, and a second subset of third word lines (which are the first subset of the third electrically conductive layers 46) in the third semiconductor die 903. Third word line drivers 720W of the third peripheral circuit 720 in the third semiconductor die 903 drives a third subset of the first word lines (which are the first subset of the first electrically conductive layers 46) in the first semiconductor die 901, a third subset of the second word lines (which are the first subset of the second electrically conductive layers 46) in the second semiconductor die 902, and a third subset of third word lines (which are the first subset of the third electrically conductive layers 46) in the third semiconductor die 903. Generally, an output node of a word line driver circuit 720W can be connected to a first word line in the first semiconductor die 901, a second word line in the second semiconductor die 902, and a third word line in the third semiconductor die 903. Thus, the total footprint for the word line driver circuit can be reduced through sharing of word line driver output nodes across the multiple semiconductor dies (901, 902, 903).

In one embodiment, each peripheral circuit 720 of a semiconductor die (901, 902, or 903) can comprise select line drivers 720S having a respective set of select line driver output nodes that are electrically connected to select-level electrically conductive layers (which are a subset of the electrically conductive layers 46) within the same semiconductor die (901, 902, or 903), and is electrically isolated from all select-level electrically conductive layers in different semiconductor dies in a split select line driver configuration. Alternatively, the above described non-split select line driver configuration may be used instead, in which select line drivers 720S having a respective set of select line driver output nodes that are electrically connected to select-level electrically conductive layers (which are a subset of the electrically conductive layers 46) within the same semiconductor die and within other semiconductor dies (901, 902, or 903). Each set of select line driver output nodes may include source-side select line driver output nodes that are electrically connected to source-side select lines, and drain-side select line driver output nodes that are electrically connected to drain-side select lines.

Each peripheral circuit 720 of a semiconductor die (901, 902, or 903) can comprise a respective bit line driver circuit 720B having a respective set of bit line driver output nodes configured to be electrically connected to, and to drive, a respective subset of the bit lines 92 in the first three-dimensional memory array in the first semiconductor die 901, a respective subset of the bit lines in the second three-dimensional memory array in the second semiconductor die 902, and a respective subset of the bit lines in the third three-dimensional memory array in the third semiconductor die 903. In this case, each bit line driver output node may be connected to a bit line in the first semiconductor die 901, a bit line in the second semiconductor die 902, and a bit line in the third semiconductor die 903. Thus, the total footprint for the bit line driver circuit 720B can be reduced through sharing of bit line driver output nodes across the multiple semiconductor dies (901, 902, 903). Alternatively, each bit line driver circuit 720B may be electrically connected to only bit lines 92 located in the same semiconductor die as the respective bit line driver circuit 720B.

Figure 18:
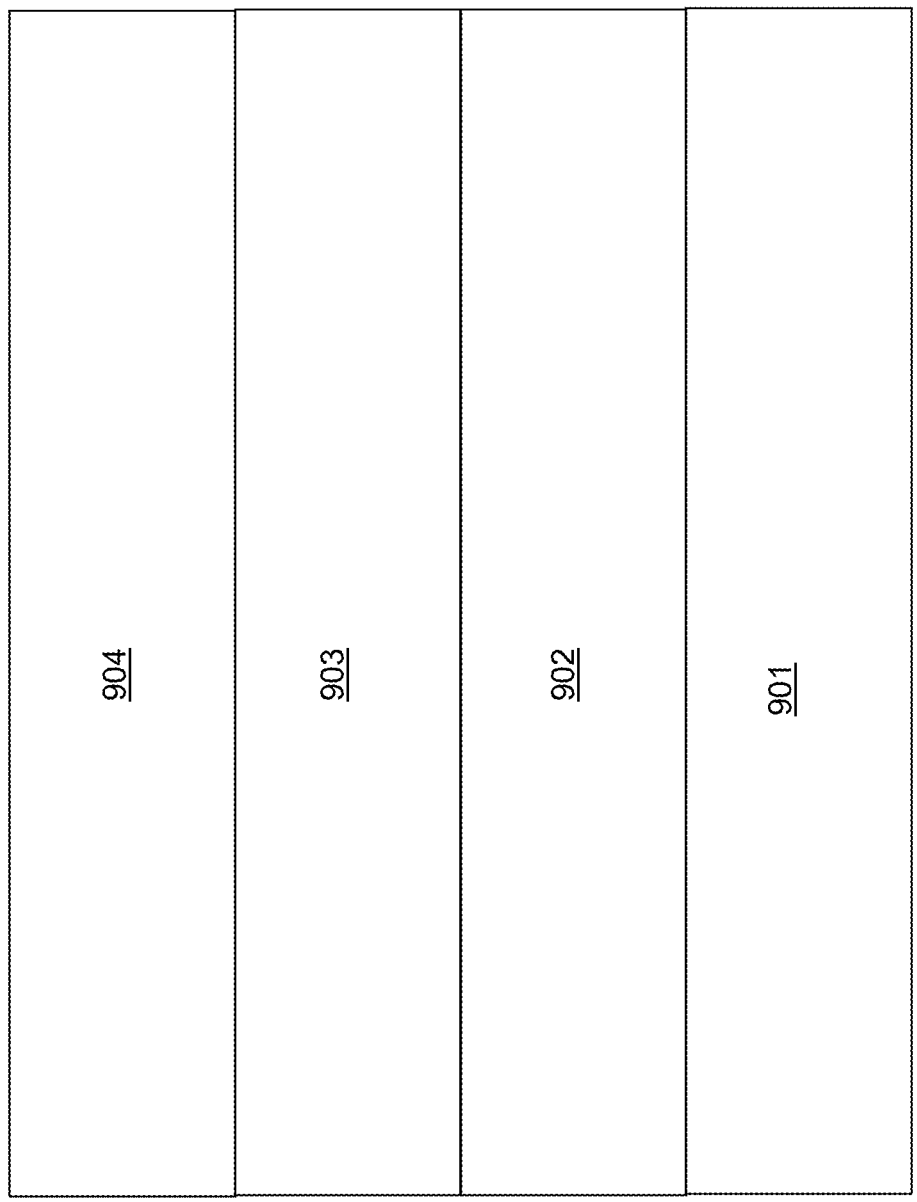
FIG. 18 is a schematic vertical cross-sectional view of a second alternative embodiment of the first exemplar structure according to the first embodiment of the present disclosure.

Referring to FIG. 18, a second alternative embodiment of the first exemplary structure is illustrated, which can be derived by modifying the first exemplary structure of FIGS.

14-16 or the first alternative embodiment of the first exemplary structure of FIG. 17 to bond four or more semiconductor dies (901, 902, 903, 904). The word line drivers 720W of each peripheral circuit 720 and/or the bit line drivers 720B of each peripheral circuit 720 can be shared among four or more semiconductor dies (901, 902, 903, 904). Generally, if N semiconductor dies including a respective three-dimensional memory array and a respective peripheral circuit 720 are vertically stacked and bonded to each other, then each word line driver circuit 720W in each respective one of N semiconductor die can drive 1/N times the total number of first word lines in the first semiconductor die 901, 1/N times the total number of second word lines in the second semiconductor die 902, and so on up to 1/N times the total number of N-th word lines in the N-th semiconductor die. Alternatively or additionally, if N semiconductor dies including a respective three-dimensional memory array and a respective peripheral circuit 720 are vertically stacked and bonded to each other, each bit line driver circuit 720B in each respective one of N semiconductor die can drive 1/N times the total number of first bit lines in the first semiconductor die 901, 1/N times the total number of second bit lines in the second semiconductor die 902, and so on up to 1/N times the total number of N-th bit lines in the N-th semiconductor die.

Figure 19:
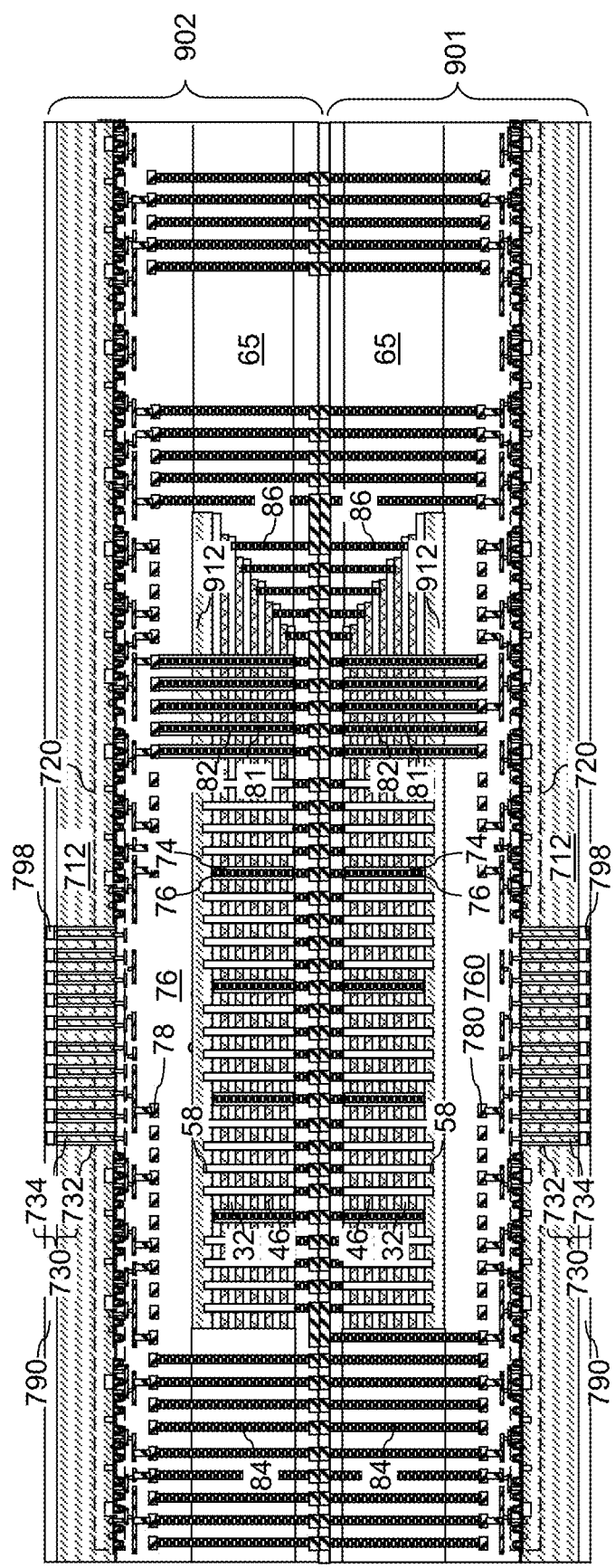
FIG. 19 is a vertical cross-sectional view of a third alternative embodiment of the first exemplary structure according to the first embodiment of the present disclosure.
Figure 20:
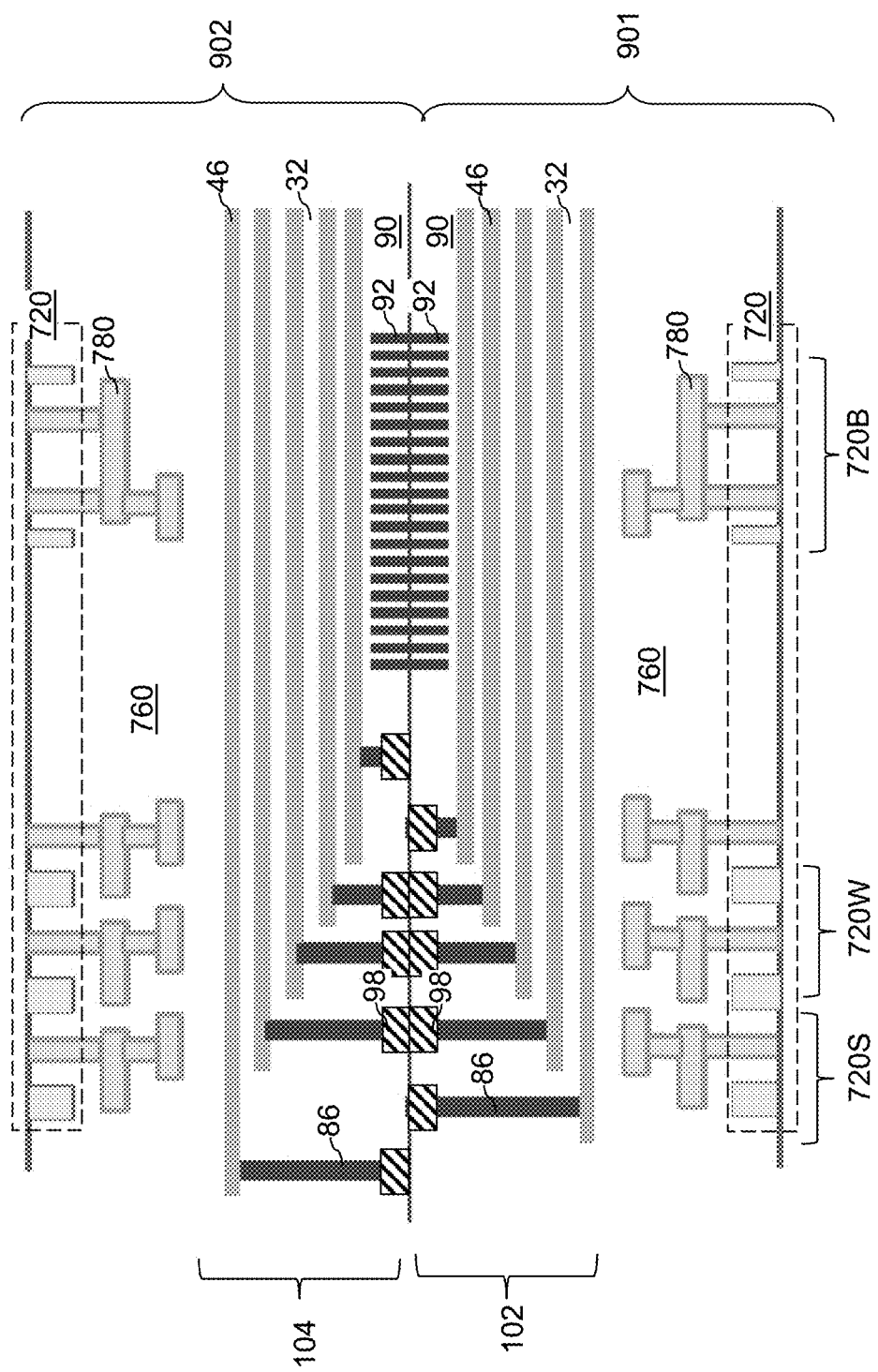
FIG. 20 is a schematic vertical cross-sectional view of the third alternative embodiment of the first exemplary structure of FIG. 19.

Referring to FIGS. 19 and 20, a third alternative configuration of the first exemplary structure can be derived from any configuration of the first exemplary structure described above such that bit lines 92 between a bonded pair of semiconductor dies (901, 902) are directly bonded to each other across the bonding interface. Thus, a bit line 92 within a first semiconductor die 901 may be bonded to a bit line 92 within a second semiconductor die 902. In one embodiment, each bit line 92 within the first semiconductor die 901 may be bonded to a respective bit line 92 within the second semiconductor die 902. Thus, in this alternative embodiment, extra bonding pads between respective bit lines are omitted.

Figure 21:
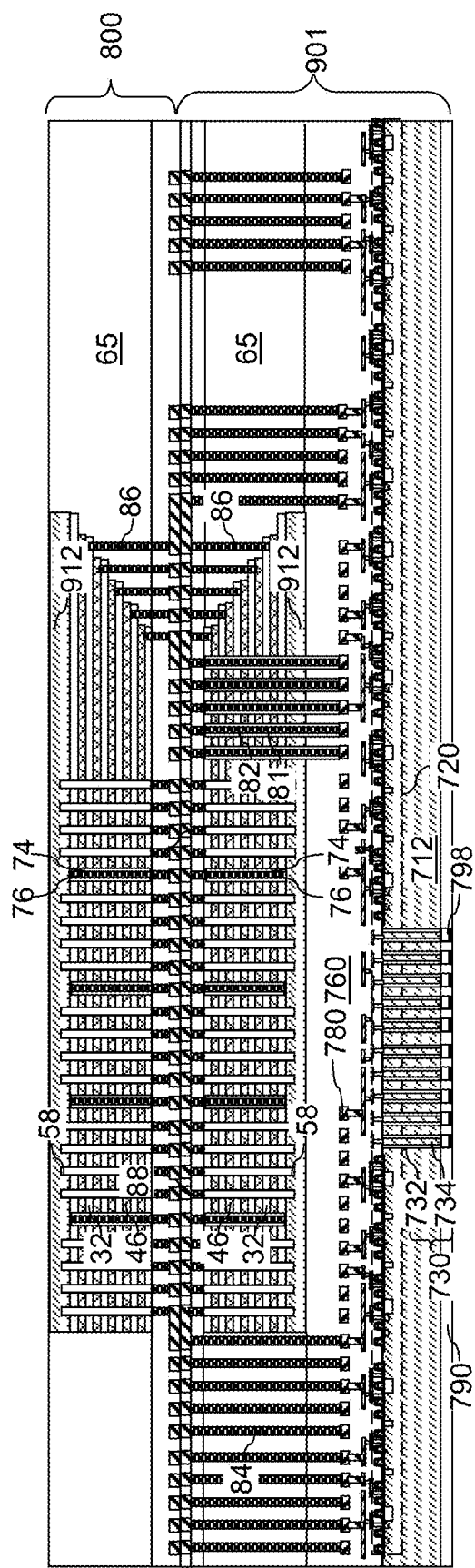
FIG. 21 is a vertical cross-sectional view of a fourth alternative embodiment of the first exemplary structure according to the first embodiment of the present disclosure.
Figure 22A:
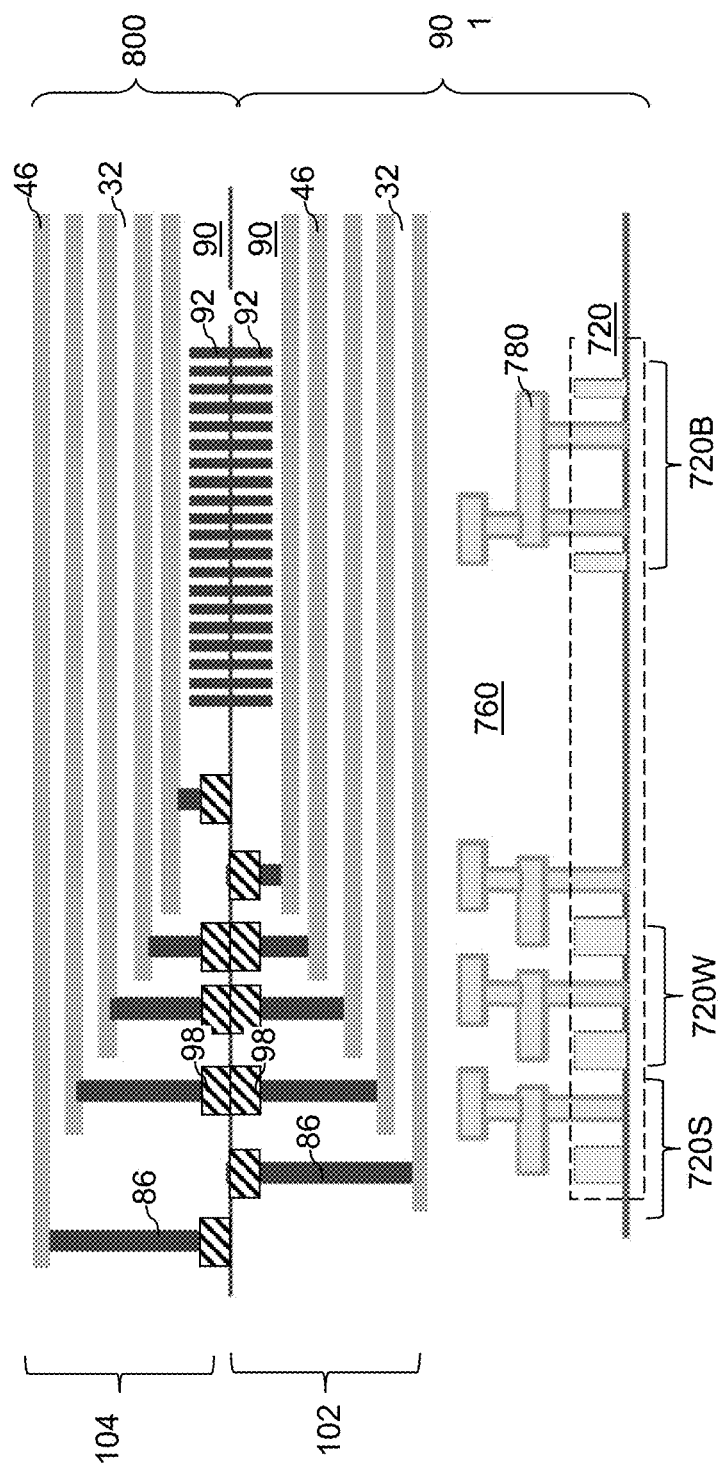
FIG. 22A is a schematic vertical cross-sectional view of the fourth alternative embodiment of the first exemplary structure of FIG. 21.

Referring to FIGS. 21 and 22A, a fourth alternative configuration of the first exemplary structure can be derived from the third alternative configuration of the first exemplary structure by omitting formation of one or more peripheral circuits 720. In this case, one or more of the bonded semiconductor dies may include a memory die 800 that does not include a peripheral circuit 720. Optionally, one or more substrate semiconductor layer 712 may be omitted or removed. The allocation of drive load across remaining peripheral circuits 720 can be adjusted to accommodate omission of one or more peripheral circuits 720. For example, if the bonded assembly includes N semiconductor dies (901, 800) and if M peripheral circuits 720 (in which M is less than N) are present within the bonded assembly, then each word line driver circuit 720W within a peripheral circuit 720 may be configured to drive 1/M times the total number of word lines within each semiconductor die simultaneously. N word lines from the N semiconductor dies can be connected to a same word line driver output node of a word line driver circuit 720W. Alternatively or additionally, each bit line driver circuit 720B within a peripheral circuit 720 may be configured to drive 1/M times the total number of bit lines 92 within each semiconductor die simultaneously. N bit lines from the N semiconductor dies can be connected to a same bit line driver output node of a bit line driver circuit 720B. In this configuration, the select lines (e.g., source-side select lines 46S or ("SGS") and drain-side select lines 46D ("SGD")) in each semiconductor die (800, 901) are electrically connected to the select line driver circuit 720S separately.

In the configuration of FIGS. 21 and 22A, the bit lines 92 of both semiconductor die (800, 901) are bonded directly to each other without using intermediate bonding pads 98. The bit lines 92 of the semiconductor die 901 are electrically connected to the bit line driver circuit 720B of the same semiconductor die 901. The bit lines 92 of the memory die 800 are electrically connected to the bit line driver circuit 720B of the semiconductor die 901 through the respective bonded bit lines 92 of the semiconductor die 901.

Figure 22B:
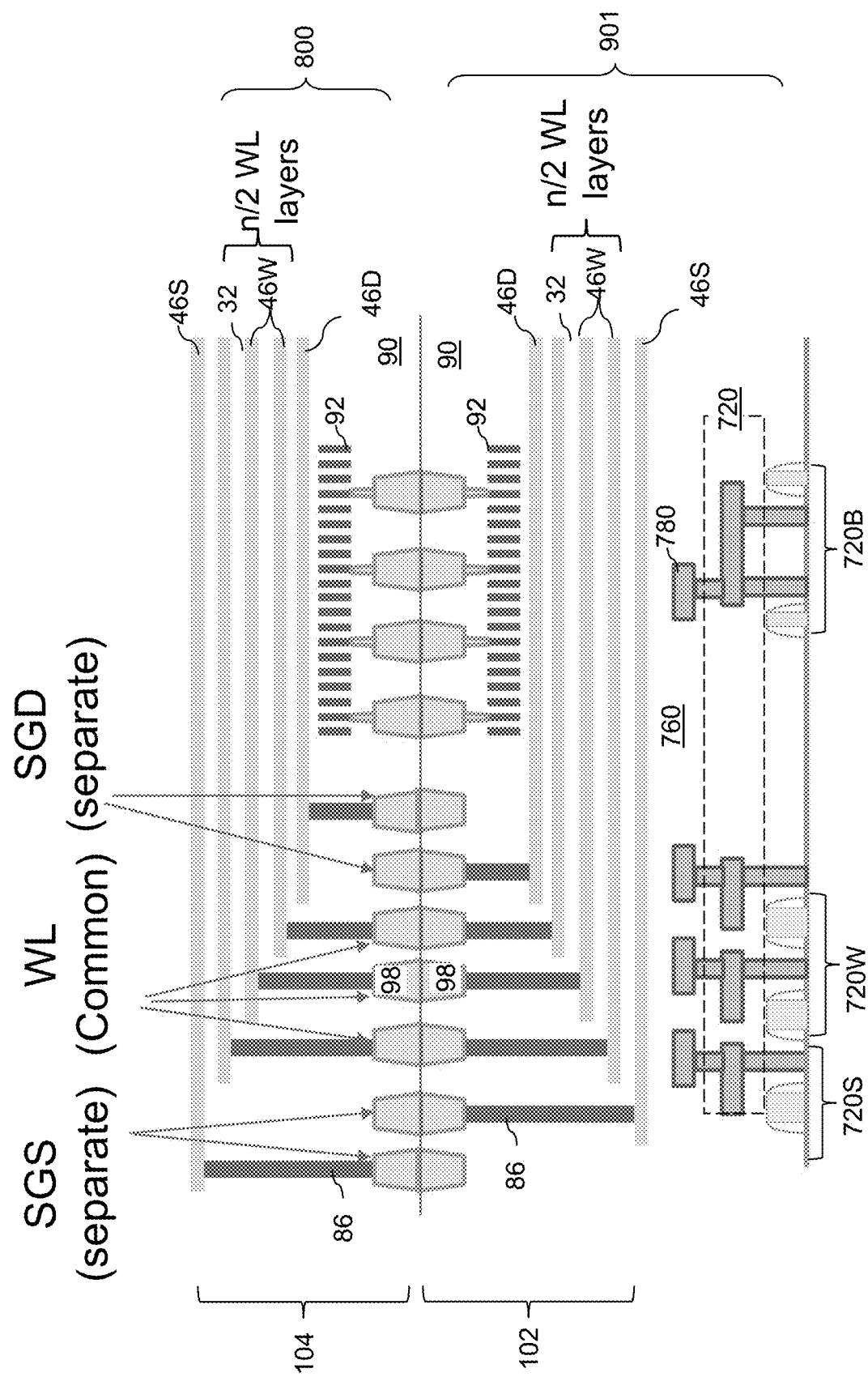
FIG. 22B is a schematic vertical cross-sectional view of a fifth alternative embodiment of the first exemplary structure according to the first embodiment of the present disclosure.

Referring to FIG. 22B, a fifth alternative configuration of the first exemplary structure can be derived from the fourth alternative configuration of the first exemplary structure by adding bonding pads 98 between the bit lines 92 of the bonded semiconductor die (800, 901). In the configuration of FIG. 22B, the bonding pads 98 of each respective semiconductor die (800, 901) are bonded to each other to electrically connect the respective bit lines 92 of both semiconductor die (800, 901) to each other and to the bit line driver circuit 720B of the semiconductor die 901.

As shown in FIG. 22B, the respective word lines 46W in each semiconductor die (800, 901) are electrically connected to each other through contact via structures 86 and bonding pads 98 and are connected in common to the same word line driver circuit 720W. In contrast, the select lines (e.g., source-side select lines 46S or ("SGS") and drain-side select lines 46D ("SGD")) in each semiconductor die (800, 901) are electrically connected to the select line driver circuit 720S separately.

Thus, "n" effective word lines in the two semiconductor die (800, 901) are split into n/2 word line parts 46W located in the memory die 800 and n/2 word line parts 46W located in the first semiconductor die 901. However, the respective word lines e.g., word lines 46W having the same number counting from the source-side select line in each die) are electrically connected to each other and are driven by the output node 724 (e.g., source or drain electrode) of the same word line switching transistor 722 of the word line driver circuit 720W. Thus, the word line driver circuit effectively drives n/2 word lines due to the electrical connection of the respective word lines. This reduces the total area of the word line driver circuit 720W in half compared to having n word lines in one semiconductor die being driven separately by a word line driver circuit in the same semiconductor die.

Figure 23A:
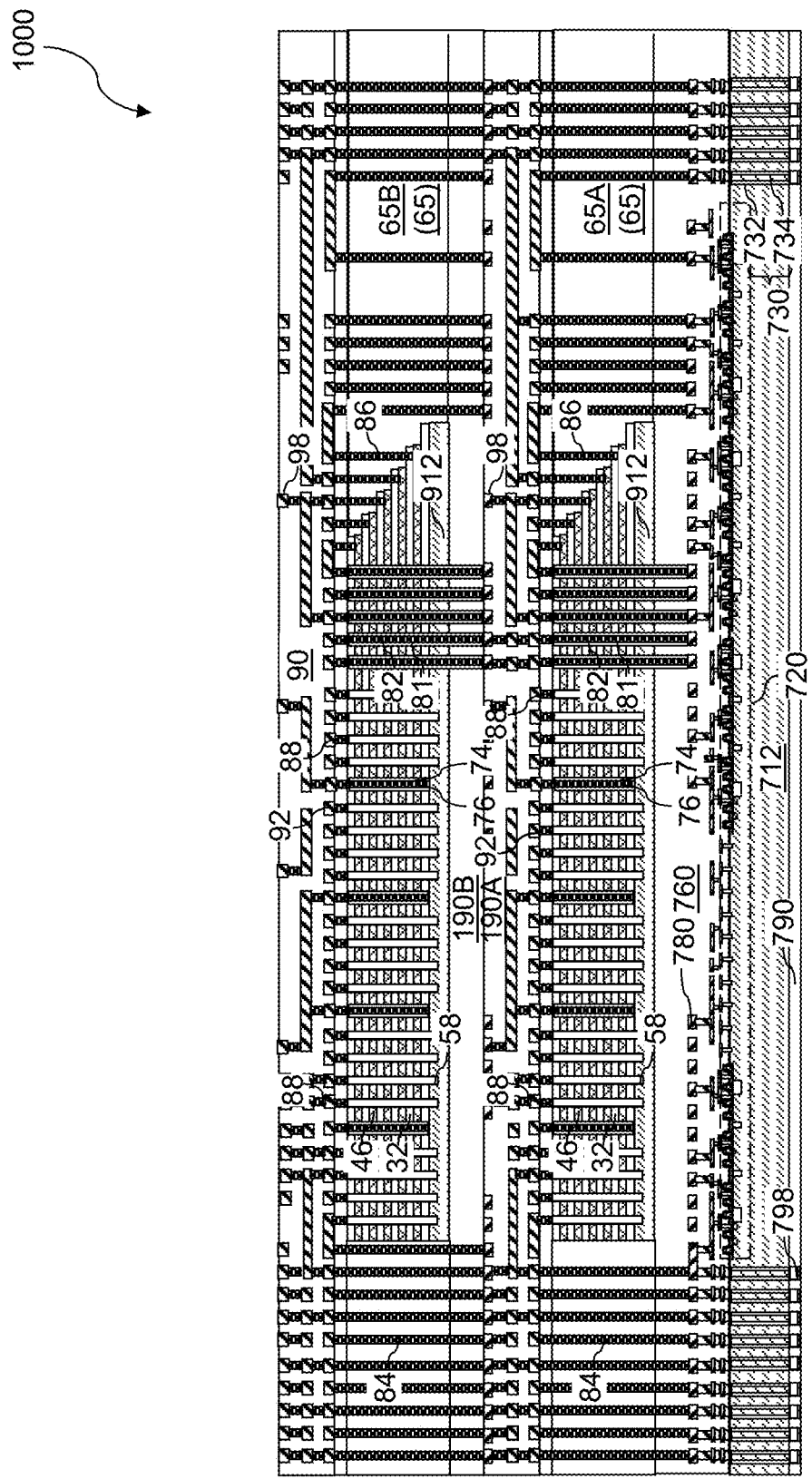
FIG. 23A is a vertical cross-sectional view of a sixth alternative embodiment of the first exemplary structure according to the first embodiment of the present disclosure.
Figure 23B:
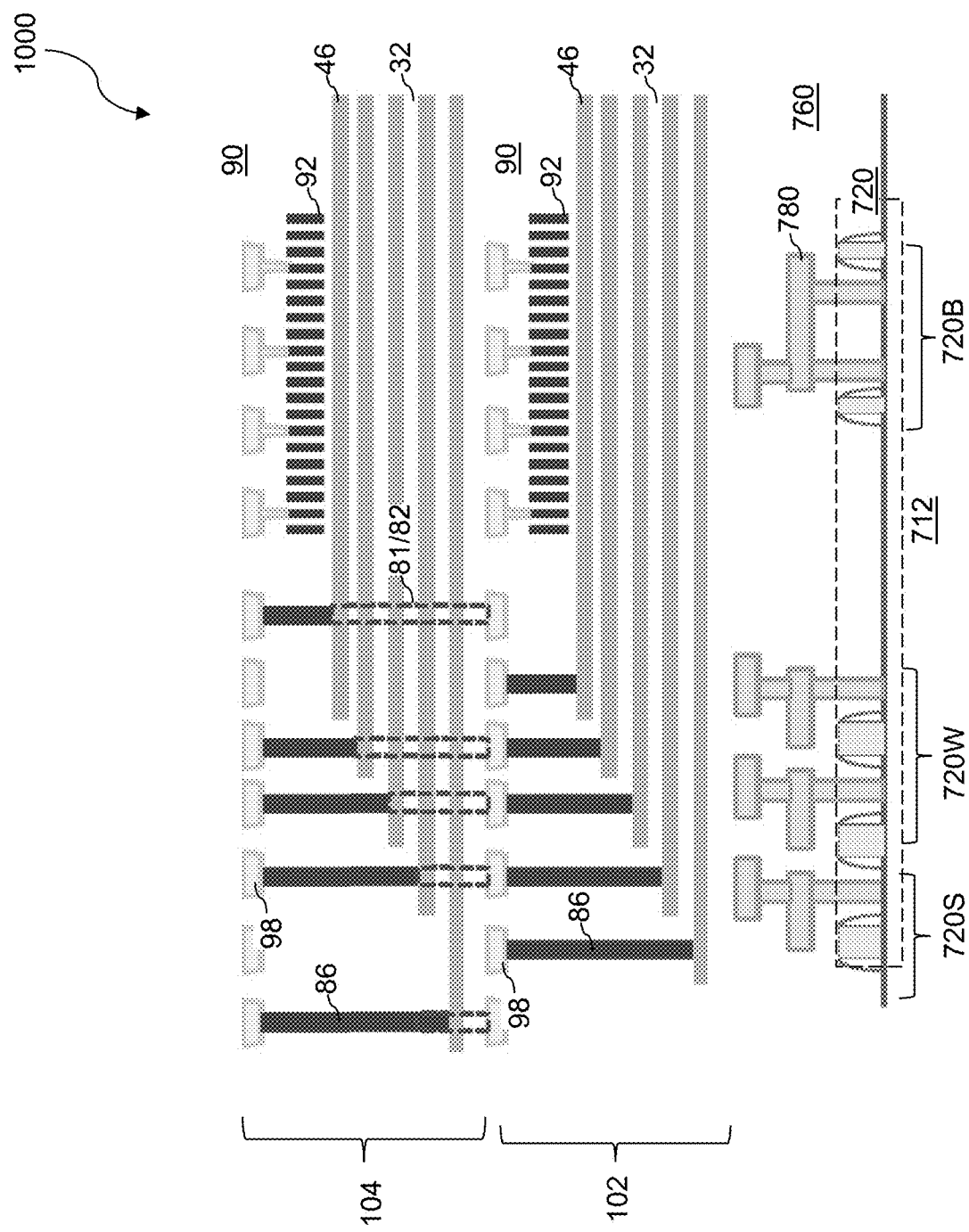
FIG. 23B is a schematic vertical cross-sectional view of the sixth alternative embodiment of the first exemplary structure of FIG. 23A.

While the embodiments of FIGS. 1 to 22B illustrate bonded assemblies of two or more semiconductor die, the sixth alternative configuration of the first exemplary structure shown in FIGS. 23A and 23B includes both the first peripheral circuit 720 and both the first three-dimensional memory array 102 and the second three-dimensional memory array 104 located in the same semiconductor die 1000.

The semiconductor die 1000 can be derived from the first semiconductor die 901 of FIG. 9 by depositing a second three-dimensional memory array directly on a top surface of the distal dielectric material layers 90 of the first exemplary structure of FIG. 9. In other words, the second three-dimensional memory array 104 provided in the second semiconductor die 902 in FIG. 10 is deposited layer by layer directly on the top surface of the distal dielectric material layers 90 instead of bonding the second semiconductor die 902 to the first semiconductor die 901.

Generally, a peripheral circuit 720 comprising field effect transistors 722 and dielectric material layers 760 embedding metal interconnect structures 780 on a top surface of a semiconductor substrate 712. A first three-dimensional memory array 102 can be formed layer by layer over the peripheral circuit 720. The first three-dimensional memory array 102 includes a first alternating stack of first insulating layers 32 and first electrically conductive layers 46 of first word lines and first select lines, and first memory stack structures 55 vertically extending through the first alternating stack (32, 46) can be formed by deposition and patterning of material portions over the peripheral circuit 720. A second three-dimensional memory array 104 is formed layer by layer over the first three-dimensional memory array 102. The second three-dimensional memory array 104 includes a second alternating stack of second insulating layers 32 and second electrically conductive layers 46 of second word lines and second select lines, and second memory stack structures 55 vertically extending through the second alternating stack (32, 46) can be formed. Word line driver output nodes 724 of the peripheral circuit 720 are electrically connected to the first word lines of first electrically conductive layers 46 and to a second word lines of the second electrically conductive layers 46.

In one embodiment, a first retro-stepped dielectric material portion 65A can be formed such that the first retro-stepped dielectric material portion 65A contacts first stepped surfaces of the first alternating stack of the first insulating layers 32 and the first electrically conductive layers 46. First contact via structures (such as the through-dielectric contact via structures 84) can vertically extend through the first retro-stepped dielectric material portion 65A directly on a respective one of the first electrically conductive layers 46 within the first alternating stack (32, 46). A second retro-stepped dielectric material portion 65B can be formed the second retro-stepped dielectric material portion 65B contacts second stepped surfaces of the second alternating stack of the second insulating layer 32 and the second electrically conductive layers 46. Second contact via structures (such as the through-dielectric contact via structures 84) can be formed through the second retro-stepped dielectric material portion 65B directly on a respective one of the second electrically conductive layers 46.

Referring to FIGS. 1-23B and according to the first embodiment of the present disclosure, a semiconductor structure includes a first peripheral circuit 720 comprising field effect transistors 722 and dielectric material layers 760 embedding metal interconnect structures 780. As shown in FIGS. 16A, 16B, 20, 22A, 22B and 23B, a first three-dimensional memory array 102 overlies the first peripheral circuit 720 and includes a first alternating stack of first insulating layers 32 and first electrically conductive layers 46 comprising first word lines 46W and first select lines (46S, 46D), and first memory stack structures 55 vertically extending through the first alternating stack. A second three-dimensional memory array 104 overlies the first three-dimensional memory array 102 and includes a second alternating stack of second insulating layers 32 and second electrically conductive layers 46 comprising second word lines 46W and second select lines (46S, 46D), and second memory stack structures 55 vertically extending through the second alternating stack. The first peripheral circuit 720 comprises a first word line driver circuit 720W having first word line driver output nodes 724 electrically connected to at least some of the first word lines 46W and at least some of the second word lines 46W, and wherein each first word line is electrically connected to a respective second word line.

In one embodiment, each first word line driver output node 724 within a subset of the first word line driver output nodes is electrically connected to a respective word line switching transistor 722, is electrically connected to a respective first word line 46W, and is electrically connected to a respective second word line 46W.

In one embodiment, the first peripheral circuit 720 further comprises a first select line driver circuit 720S comprising first select line driver output nodes electrically connected to the first select lines (46S, 46D) in the first array 102 and not electrically connected to any of the second electrically conductive layers 46 in the second array 104, and second selective line driver output nodes electrically connected to the second select lines (46S, 46D in the second array 104, and not electrically connected to any of the first electrically conductive layers 46 in the first array 102. The first select line driver output nodes comprise source-side select line driver output nodes electrically connected to source-side select lines 46S of the first select lines and drain-side select line driver output nodes electrically connected to drain-side select lines 46D of the first select lines in the first array 102.

In one embodiment, each of the first memory stack structures 55 comprises a respective first vertical semiconductor channel 60 and a respective first vertical stack of memory elements in the second memory film 50, and each of the second memory stack structures 55 comprises a respective second vertical semiconductor channel 60 and a respective second vertical stack of memory elements in the second memory film 50. The first three-dimensional memory array 102 further comprises first bit lines 92 electrically connected to a first end of a respective subset of the first vertical semiconductor channels 60, and the second three-dimensional memory array 104 further comprises second bit lines 92 electrically connected to a first end of a respective subset of the second vertical semiconductor channels 60. The first peripheral circuit 720 further comprises a first bit line driver circuit 720B having first bit line driver output nodes electrically connected to a respective one of the first bit lines 92 and to a respective one of the second bit lines 92.

In one embodiment, the first peripheral circuit 720 and the first three-dimensional memory array 102 are located in a first semiconductor die 901, and the second three-dimensional memory array 104 is located in a second semiconductor die (800, 902) which is bonded to the first semiconductor die 901. The first semiconductor die 901 further comprises first dielectric material layers 760 embedding first metal interconnect structures 780 and first metal bonding pads 98, and the second semiconductor die (800, 902) further comprises second dielectric material layers 780 embedding second metal interconnect structures 760 and second metal bonding pads 98 which are bonded to respective first metal bonding pads 98.

In the configuration shown in FIGS. 21 to 22B, the first word line driver output nodes 724 of the first word line driver circuit 720W are electrically connected all of the first word lines 46W of the first semiconductor die 901 and to all of the second word lines 46 of the second semiconductor die (800, 902) through a subset of mating pairs of the first metal bonding pads 98 and the second metal bonding pads 98.

In contrast, in the configuration shown in FIGS. 14 to 20, the second semiconductor die 902 further comprises a second peripheral circuit 720 comprising a second word line driver circuit 720W having second word line driver output nodes 724. The first word line driver output nodes of the first word line driver circuit are electrically connected to a first subset of the first word lines 46W in the first semiconductor die 901 and to a first subset of the second word lines 46W in the second semiconductor die 902 through a first subset of mating pairs of the first metal bonding pads and the second metal bonding pads 98. The second word line driver output nodes 724 of the second word line driver circuit 720W are electrically connected to a second subset of the second word lines 46W in the second semiconductor die 902 and to a second subset of the first word lines 46W through a second subset of mating pairs of the first metal bonding pads and the second metal bonding pads 98.

In the configuration shown in FIGS. 14 to 20, the first peripheral circuit 720 further comprises a first select line driver circuit 720S comprising first select line driver output nodes electrically connected to the first select lines (46S, 46D) in the first semiconductor due 901 and not electrically connected to any of the second electrically conductive layers 46 in the second semiconductor die 902. The second peripheral circuit 720 further comprises a second select line driver circuit 720S comprising second select line driver output nodes electrically connected to the second select lines (46S, 46D) in the second semiconductor die 902 and not electrically connected to any of the first electrically conductive layers 46 in the first semiconductor die 901.

In one embodiment, the first three-dimensional memory array 102 comprises first bit lines 92 electrically connected to a first end of a respective subset of the first vertical semiconductor channels 60, and the second three-dimensional memory array 104 comprises second bit lines 92 electrically connected to a first end of a respective subset of the second vertical semiconductor channels 60 and electrically connected to the respective first bit lines. The first peripheral circuit further comprises a first bit line driver circuit 720B having first bit line driver output nodes electrically connected to a first subset of the first bit lines and to a first subset of the second bit lines, and the second peripheral circuit further comprises a second bit line driver circuit 720B having second bit line driver output nodes electrically connected to a second subset of the first bit lines and to a second subset of the second bit lines. In the embodiment shown in FIGS. 20 and 22A, each one of the second bit lines is bonded to a respective one of the first bit lines by metal-to-metal bonding.

In the embodiment of FIG. 18, the structure further comprises a third semiconductor die 903 comprising a third three-dimensional memory array including a third alternating stack of third insulating layers and third electrically conductive layers comprising third word lines and third select lines, and third memory stack structures vertically extending through the third alternating stack, a third peripheral circuit comprising a third word line driver circuit, and third dielectric material layers embedding third metal interconnect structures and third metal bonding pads. The first word line driver output nodes 724 are electrically connected to at least some of the third word lines.

Figure 24:
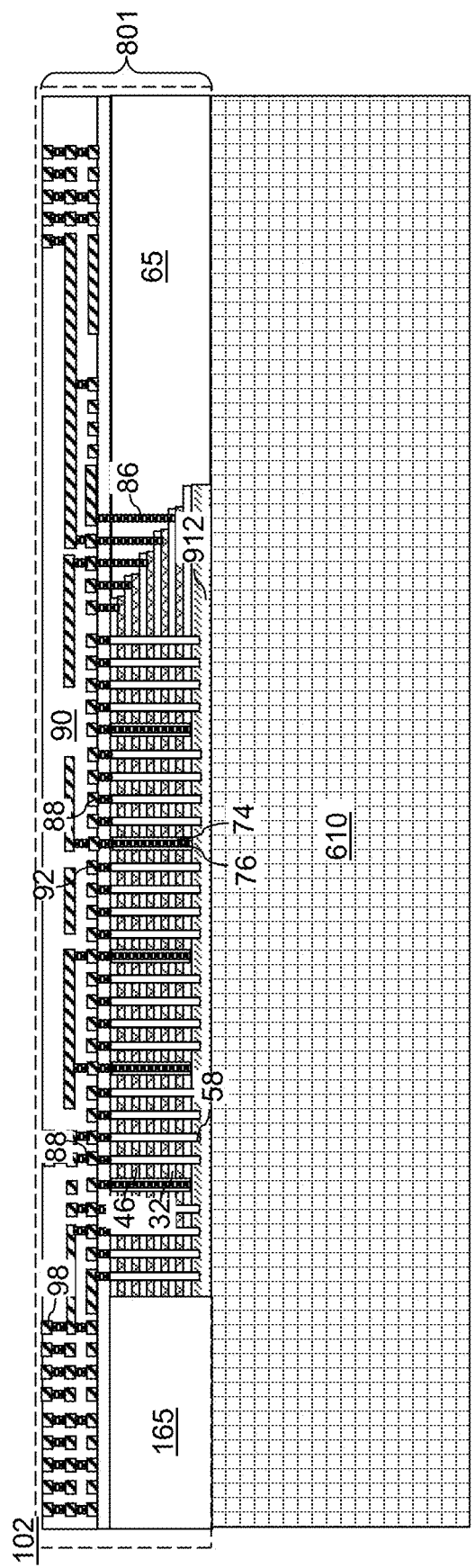
FIG. 24 is a vertical cross-sectional view of a first memory die according to a second embodiment of the present disclosure.

Referring to FIG. 24, a first semiconductor die 801 according to a second embodiment of the present disclosure can be derived from the first semiconductor die 901 described with reference to FIG. 9 by employing a first handle substrate 610 in lieu of a combination a first substrate including a substrate semiconductor layer 712, a first peripheral circuit 720, and first proximal dielectric material layers 760 embedding first proximal metal interconnect structures 780. In this case, the through-stack contact via structures 82 and the through-dielectric contact via structures 84 can be omitted. The first semiconductor die 801 may be a memory die.

Generally, a first semiconductor die 801 comprising a first three-dimensional memory array 102 is provided. The first three-dimensional memory array 102 includes a first alternating stack of first insulating layers 32 and first electrically conductive layers 46 comprising word lines and select lines, and first memory stack structures 55 vertically extending through the first alternating stack (32, 46). Each of the first memory stack structures 55 comprises a respective first vertical semiconductor channel 60 and a respective first vertical stack of memory elements in a memory film 50. The first three-dimensional memory array 102 can comprise first bit lines 92 electrically connected to a first end of a respective subset of the first vertical semiconductor channels 60.

Figure 25:
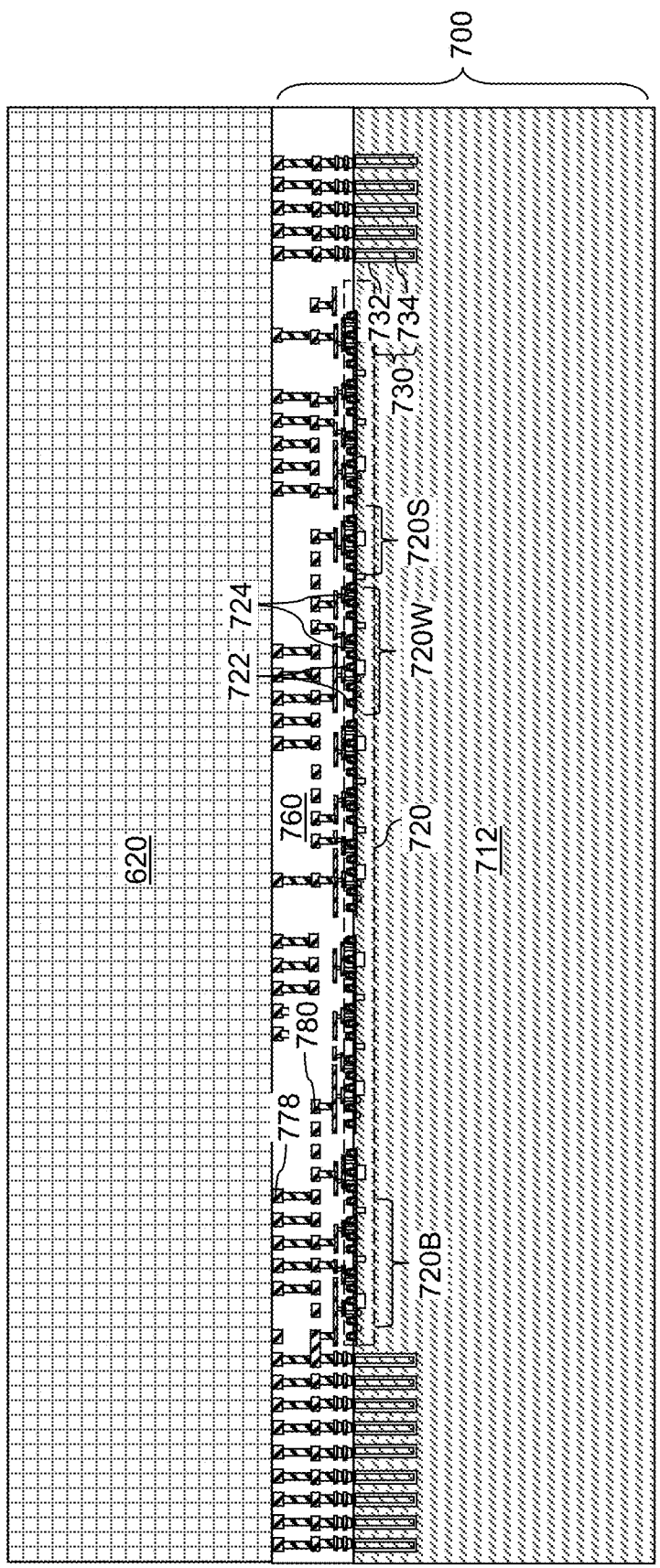
FIG. 25 is a vertical cross-sectional view of a logic die according to the second embodiment of the present disclosure.

Referring to FIG. 25, a logic die 700 can be provided, which can be derived from the first semiconductor die 901 illustrated in FIG. 1 by modifying design layouts for the through-substrate connection structures 730 and by forming metal bonding pads 778 within a topmost layer of the proximal dielectric material layers 760. The pattern of the through-substrate connection structures 730 and the pattern of the metal bonding pads 778 can be selected to facilitate bonding with other semiconductor dies (such as the first semiconductor die 801) in subsequent processing steps.

The peripheral circuit 720 can comprise complementary metal oxide semiconductor (CMOS) transistors 722. The peripheral circuit 720 can comprise proximal metal interconnect structures 780 embedded within the proximal dielectric material layers 760. According to an aspect of the present disclosure, the peripheral circuit 720 comprises first word line driver circuit 720W containing word line driver output nodes 724 that are configured to be subsequently electrically connected to a first subset of the first electrically conductive layers (i.e., first word lines) in the first three-dimensional memory array 102 of FIG. 23 and to be subsequently electrically connected to a first subset of the second electrically conductive layers (i.e., second word lines) in a second three-dimensional memory array 104 to be described below.

In one embodiment, the peripheral circuit 720 can comprise first select line driver circuit 720S containing select line driver output nodes that are configured to be electrically connected to a subset of the first electrically conductive layers (i.e., first select lines) of the first three-dimensional memory array and to be electrically isolated from each of the second electrically conductive layers of the second three-dimensional memory array.

In one embodiment, the first select line driver output nodes may include first source-side select line driver output nodes that are configured to be electrically connected to source-side select lines of the first electrically conductive layers of the first three-dimensional memory array 102. In one embodiment, the first select line driver output nodes may include first drain-side select line driver output nodes that are configured to be electrically connected to drain-side select lines of the first electrically conductive layers of the first three-dimensional memory array 102.

In one embodiment, the peripheral circuit 720 can comprise a first bit line driver circuit 720B having first bit line driver output nodes configured to be electrically connected to, and to drive, a first subset of the first bit lines 92 in the first three-dimensional memory array 102, and a second bit line driver circuit having second bit line driver output nodes configured to be electrically connected to, and to drive, a first subset of the second bit lines 92 in a second three-dimensional memory array 104.

A second handling substrate 620 can be attached to the front surface of the logic die 700.

Figure 26:
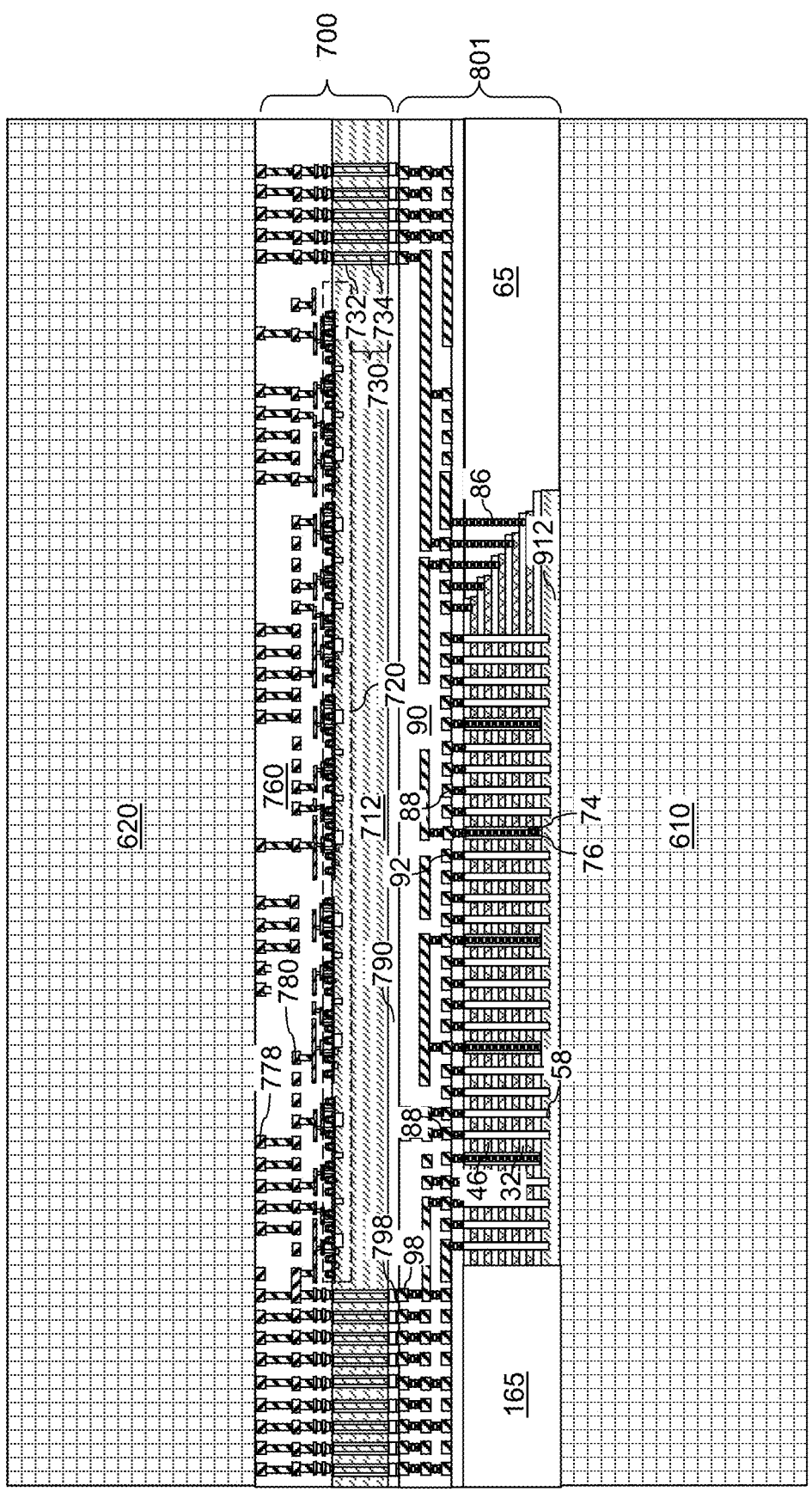
FIG. 26 is a vertical cross-sectional view of a second exemplary structure including a bonded assembly of the first memory die and the logic die according to the second embodiment of the present disclosure.

Referring to FIG. 26, the substrate semiconductor layer 712 of the logic die 700 may be thinned. For example, the backside of the substrate semiconductor layer 712 of the logic die 700 can be thinned, for example, by grinding, polishing, an anisotropic etch process, and/or an isotropic etch process. In one embodiment, the backside of the substrate semiconductor layer 712 of the logic die 700 can be thinned until surfaces of the laterally-isolated through-substrate via structures 734 are physically exposed. The through-substrate connection structures 730 can vertically extend through the thinned substrate semiconductor layer 712 of the logic die 700. Each through-substrate connection structure 730 can include a laterally-isolated through-substrate via structure 734 and a substrate insulating spacer 732. A backside dielectric material layer 790 can be formed on the backside of the substrate semiconductor layer 712 of the logic die 700, and backside bonding pads 798 can be formed in the backside dielectric material layer 790. Each backside bonding pads 798 can be formed directly on a respective one of the laterally-isolated through-substrate via structure 734.

Subsequently, the logic die 700 can be bonded to the first semiconductor die 801, for example, by bonding the first metal bonding pads 98 of the first semiconductor die 801 to the backside bonding pads 798 of the logic die 700.

Figure 27A:
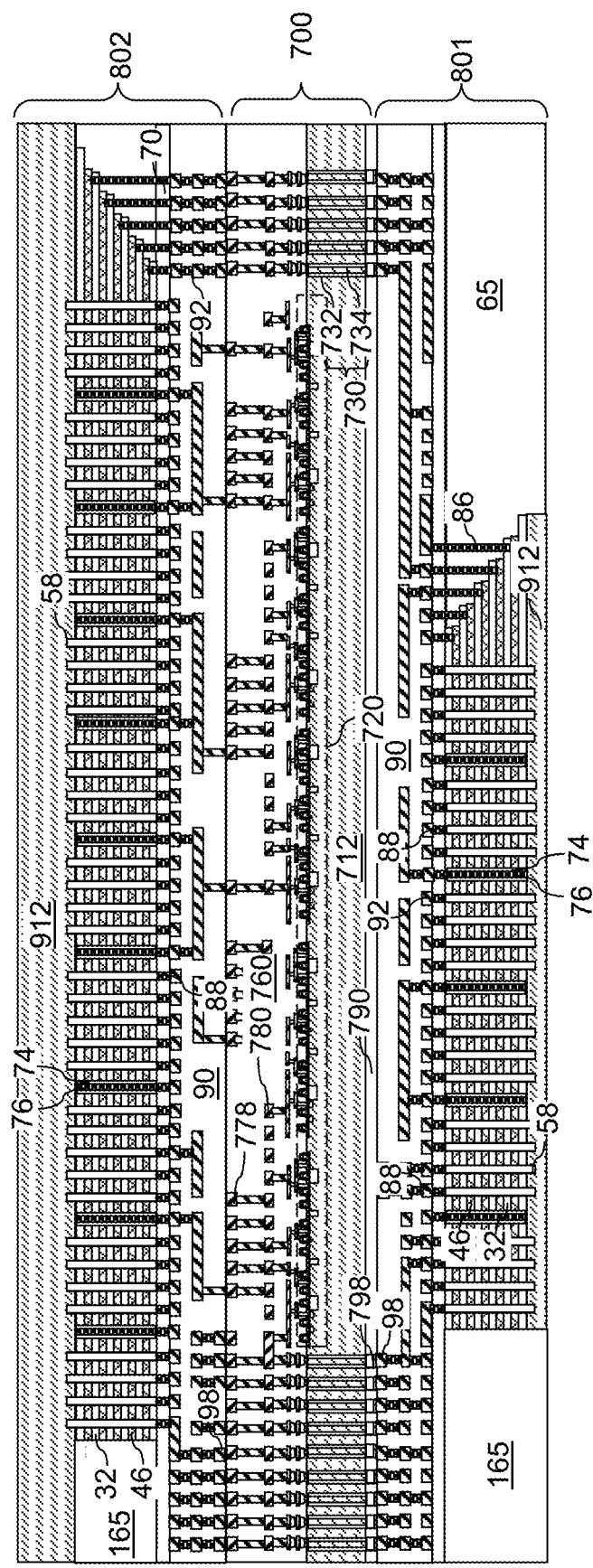
FIG. 27A is a vertical cross-sectional view of the second exemplary structure after bonding a second memory die according to the second embodiment of the present disclosure.

Referring to FIG. 27A, the second handle substrate 620 can be detached from the logic die 700. A second semiconductor die 802 can be provided, which can be manufactured in the same manner as the first semiconductor die 801 illustrated in FIG. 23 with modifications in the pattern of the metal bonding pads 98. Specifically, the pattern of the second metal bonding pads 98 in the second semiconductor die 802 can be a mirror image pattern of the pattern of the metal bonding pads 778 of the logic die.

The second semiconductor die 802 can be bonded to the logic die 700, thereby forming a bonded assembly of the first semiconductor die 801, the second semiconductor die 802, and the logic die 700 (which is a third semiconductor die). Generally, wafer-to-wafer bonding may be employed. For example, a wafer including a plurality of first semiconductor dies 801 can be bonded to a wafer including a plurality of logic dies 700. Subsequently, a wafer including a plurality of second semiconductor dies 802 can be bonded to the wafer including the plurality of logic dies 700.

The first handle substrate 610 and any handle substrate (not illustrated) that may be employed to provide mechanical support to the second semiconductor die 802 up to the processing step of bonding with the logic die 700 can be subsequently removed.

Figure 27B:
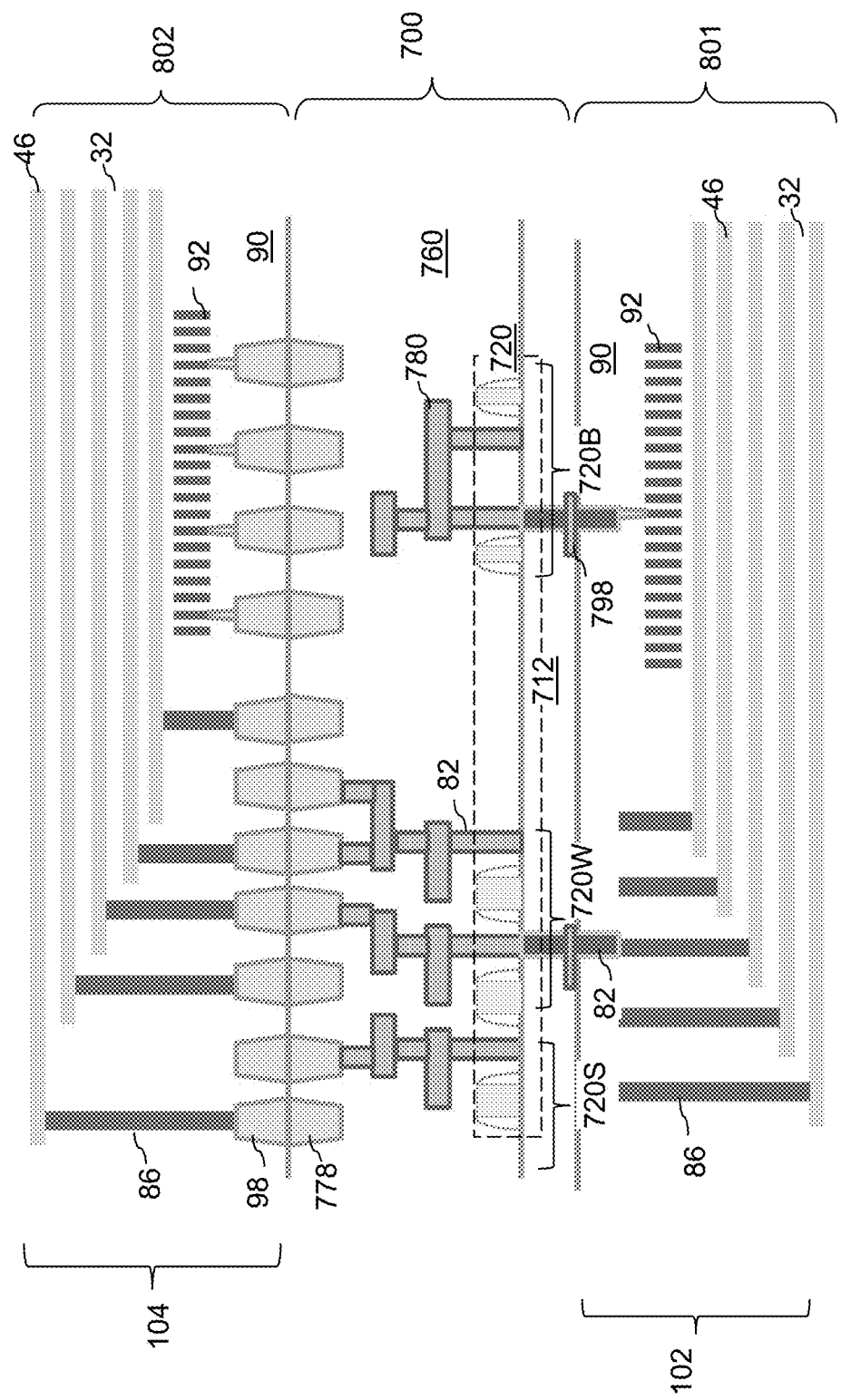
FIG. 27B is a schematic vertical cross-sectional view of an alternative embodiment of the second exemplary structure of FIG. 27A.

Referring to FIG. 27B, the contact via structures 82 may extend through the word line driver circuit 720W. The contact via structures 82 electrically connect the word line driver nodes to the respective bonding pads (778, 798) of the logic die 700.

Referring to FIGS. 24-27B and the second embodiment of the present disclosure, a bonded assembly comprises a first semiconductor die 801 comprising a first three-dimensional memory array 102 including a first alternating stack of first insulating layers 32 and first electrically conductive layers 46 comprising first word lines 46W and first select lines (46S, 46D), and first memory stack structures 55 vertically extending through the first alternating stack, a second semiconductor die 802 comprising a second three-dimensional memory array 104 including a second alternating stack of second insulating layers 32 and second electrically conductive layers 46 comprising second word lines 46W and second select lines (46S, 46D), and second memory stack structures 55 vertically extending through the second alternating stack, and a third semiconductor die 700 comprising a peripheral circuit 720 containing a word line driver circuit 720W comprising word line driver output nodes 724 electrically connected to the first word lines 46W and electrically connected to the second word lines 46W. Each of the first word lines is electrically connected to a respective one of the second word lines.

In one embodiment, each word line switching transistor 722 of the word line driver circuit 720W is electrically connected to a respective word line driver output node 724. The respective word line driver output node 724 is electrically connected a respective first word line 46W and is electrically connected to a respective second word line 46W. The respective first word line 46W is electrically connected to the respective second word line 46W.

In one embodiment, the peripheral circuit further comprises a select line driver circuit 720S. The select line driver circuit comprises source-side select line driver output nodes electrically connected to source-side select lines 46S of the first select lines, and drain-side select line driver output nodes electrically connected to drain-side select lines 46D of the first select lines.

In one embodiment, the first semiconductor die 801 comprises first metal bonding pads 98 embedded in first dielectric material layers 90, the second semiconductor die 802 comprises second metal bonding pads 98 embedded in second dielectric material layers 90, and the third semiconductor die 700 comprises third metal bonding pads 798 embedded in third dielectric material layers 760. In one embodiment, electrical connections between the first semiconductor die, the second semiconductor die, and the third semiconductor die are provided by metal-to-metal bonding between the first metal bonding pads, the second metal bonding pads, and the third metal bonding pads.

In one embodiment, each of the first memory stack structures 55 comprises a respective first vertical semiconductor channel 60 and a respective first vertical stack of memory elements in a memory film 50, each of the second memory stack structures 55 comprises a respective second vertical semiconductor channel 60 and a respective second vertical stack of memory elements in a memory film 50, the first three-dimensional memory array 102 further comprises first bit lines 92 electrically connected to a first end of a respective subset of the first vertical semiconductor channels. the second three-dimensional memory array 104 comprises second bit lines 92 electrically connected to a first end of a respective subset of the second vertical semiconductor channels, and the peripheral circuit 720 further comprises a bit line driver circuit 720B comprising bit line driver output nodes which are electrically connected to a respective one of the first or the second bit lines 92.

The various embodiments of the present disclosure can be employed to provide a vertical stack of multiple three-dimensional memory arrays (102, 104) that share a peripheral circuit 720. A word line driver output node of the peripheral circuit 720 can drive multiple electrically connected word lines 46W within the multiple three-dimensional memory arrays (102, 104). For example, a word line driver output node 724 of the peripheral circuit 720 can drive a first word line 46W in a first three-dimensional memory array 102 and a second word line 46W in a second three-dimensional memory array 104 which is electrically connected to the first word line. The total area occupied by the word line driver circuit 720W portion of the peripheral circuit 720 can be reduced by the word line driver circuit 720W between electrically connected word lines 46W that are vertically separated from each other in the multiple three-dimensional memory arrays (102, 104).

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A bonded assembly, comprising:
   a first semiconductor die comprising a first semiconductor substrate, through-substrate connection structures vertically extending through the first semiconductor substrate, and a first three-dimensional memory array located on the first semiconductor substrate and including a first alternating stack of first insulating layers and first electrically conductive layers comprising first word lines and first select lines, and first memory stack structures vertically extending through the first alternating stack;
   a second semiconductor die comprising a second three-dimensional memory array including a second alternating stack of second insulating layers and second electrically conductive layers comprising second word lines and second select lines, and second memory stack structures vertically extending through the second alternating stack; and
   a third semiconductor die comprising a peripheral circuit containing a word line driver circuit comprising word line driver output nodes electrically connected to the first word lines and electrically connected to the second word lines,
   wherein each of the first word lines is electrically connected to a respective one of the second word lines;
   wherein:
   each of the through-substrate connection structures comprises a respective substrate insulating spacer and a respective electrically conductive, laterally-isolated through-substrate via structure that is laterally surrounded by the respective substrate insulating spacer;
   each of the first word lines is electrically connected to a respective one of the second word lines through a respective electrically conductive path; and
   a subset of the electrically conductive paths between the first word lines and the second word lines extends through a subset of the through-substrate connection structures.

2. A method of making bonded assembly, comprising:
   providing a first semiconductor die comprising a first semiconductor substrate, through-substrate connection structures vertically extending through the first semiconductor substrate, and a first three-dimensional memory array located on the first semiconductor substrate and including a first alternating stack of first insulating layers and first electrically conductive layers comprising first word lines and first select lines, and first memory stack structures vertically extending through the first alternating stack;
   providing a second semiconductor die comprising a second three-dimensional memory array including a second alternating stack of second insulating layers and second electrically conductive layers comprising second word lines and second select lines, and second memory stack structures vertically extending through the second alternating stack;
   providing a third semiconductor die comprising a peripheral circuit containing a word line driver circuit comprising word line driver output nodes; and
   bonding the first, the second and the third semiconductor dies such that the word line driver output nodes are electrically connected to the first word lines and electrically connected to the second word lines, and each of the first word lines is electrically connected to a respective one of the second word lines;
   wherein:
   each of the through-substrate connection structures comprises a respective substrate insulating spacer and a respective electrically conductive, laterally-isolated through-substrate via structure that is laterally surrounded by the respective substrate insulating spacer;
   each of the first word lines is electrically connected to a respective one of the second word lines through a respective electrically conductive path; and
   a subset of the electrically conductive paths between the first word lines and the second word lines extends through a subset of the through-substrate connection structures.

* * * * *